US011605693B2

(12) United States Patent
Ahn et al.

(10) Patent No.: US 11,605,693 B2
(45) Date of Patent: Mar. 14, 2023

(54) DISPLAY APPARATUS HAVING A BENDING AREA WITH DIFFERENTLY SHAPED WIRINGS

(71) Applicant: SAMSUNG DISPLAY CO., LTD., Yongin-si (KR)

(72) Inventors: Seongsik Ahn, Yongin-si (KR); Ahram Lee, Yongin-si (KR); Minki Kim, Yongin-si (KR)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 9 days.

(21) Appl. No.: 16/533,951

(22) Filed: Aug. 7, 2019

(65) Prior Publication Data
US 2020/0119124 A1 Apr. 16, 2020

(30) Foreign Application Priority Data
Oct. 10, 2018 (KR) .................. 10-2018-0120605

(51) Int. Cl.
*H01L 27/32* (2006.01)
*H01L 51/00* (2006.01)
*H05K 1/02* (2006.01)

(52) U.S. Cl.
CPC ...... *H01L 27/3276* (2013.01); *H01L 51/0097* (2013.01); *H05K 1/028* (2013.01); *H01L 2251/5338* (2013.01)

(58) Field of Classification Search
CPC ............. H01L 27/3276; H01L 51/0097; H01L 2251/5338; H05K 1/028

USPC ........................................................ 257/773
See application file for complete search history.

(56) References Cited

U.S. PATENT DOCUMENTS

| 9,419,065 | B2 * | 8/2016 | Degner | H05K 1/028 |
| 9,472,507 | B2 * | 10/2016 | Kwak | H01L 23/562 |
| 9,490,312 | B2 * | 11/2016 | Lee | H01L 51/0097 |
| 9,818,764 | B2 * | 11/2017 | Kwon | G02F 1/13454 |
| 10,056,446 | B2 * | 8/2018 | Kim | H01L 27/3276 |
| 10,243,024 | B2 * | 3/2019 | Jin | H01L 27/1218 |
| 10,403,834 | B2 * | 9/2019 | Park | C08J 7/18 |
| 10,462,896 | B1 * | 10/2019 | Kwon | H01L 51/0097 |
| 10,665,643 | B2 * | 5/2020 | Jin | H01L 27/124 |
| 10,856,420 | B2 * | 12/2020 | Kim | H01L 51/0097 |
| 10,893,606 | B2 * | 1/2021 | Jeon | H05K 1/147 |
| 10,963,013 | B2 * | 3/2021 | Song | G06F 1/1652 |

(Continued)

FOREIGN PATENT DOCUMENTS

| EP | 3 214 652 | 9/2017 |
| KR | 10-2017-0046683 | 5/2017 |

(Continued)

*Primary Examiner* — Victoria K. Hall
(74) *Attorney, Agent, or Firm* — Kile Park Reed & Houtteman PLLC

(57) ABSTRACT

A display apparatus including a flexible substrate, the flexible substrate including a first area where an image is displayed, a second area separated from the first area, and a bending area between the first area and the second area; a display on the first area of the substrate; a pad on the second area of the substrate; and a plurality of wirings on the substrate, the plurality of wirings including a first wiring having a first shape; and a second wiring having a second shape that is different from the first shape, the first wiring and the second wiring passing through the bending area.

32 Claims, 15 Drawing Sheets

(56) References Cited

U.S. PATENT DOCUMENTS

| | | | |
|---|---|---|---|
| 11,043,548 B2* | 6/2021 | Lee | H01L 27/3276 |
| 11,056,545 B2* | 7/2021 | Jin | H01L 27/124 |
| 11,139,320 B2* | 10/2021 | Lee | H01L 51/0097 |
| 11,233,112 B2* | 1/2022 | Choi | H01L 27/3276 |
| 11,316,005 B2* | 4/2022 | Kim | H01L 51/0097 |
| 2013/0002583 A1* | 1/2013 | Jin | G06F 3/041 |
| | | | 345/173 |
| 2014/0042406 A1* | 2/2014 | Degner | H05K 1/028 |
| | | | 257/40 |
| 2014/0254111 A1* | 9/2014 | Yamazaki | H01L 51/0097 |
| | | | 361/749 |
| 2014/0367658 A1* | 12/2014 | Kwak | H01L 27/3276 |
| | | | 257/40 |
| 2015/0357395 A1* | 12/2015 | Cheon | H01L 27/3276 |
| | | | 257/40 |
| 2015/0382446 A1* | 12/2015 | Kwon | H01L 27/3276 |
| | | | 174/251 |
| 2016/0035812 A1* | 2/2016 | Kwon | H01L 29/66757 |
| | | | 257/40 |
| 2016/0062018 A1* | 3/2016 | Namkung | H01L 51/5253 |
| | | | 257/88 |
| 2016/0066409 A1* | 3/2016 | Kwon | H01L 23/562 |
| | | | 174/254 |
| 2016/0181345 A1* | 6/2016 | Lee | H01L 51/0097 |
| | | | 257/40 |
| 2016/0374193 A1* | 12/2016 | Namkung | G02F 1/1333 |
| 2017/0040406 A1* | 2/2017 | Park | H01L 51/56 |
| 2017/0077211 A1* | 3/2017 | Yamazaki | G04G 9/0088 |
| 2017/0188463 A1* | 6/2017 | Kim | H05K 1/115 |
| 2017/0244052 A1* | 8/2017 | Park | H01L 27/3248 |
| 2017/0256599 A1* | 9/2017 | Kim | H01L 27/124 |
| 2017/0288009 A1* | 10/2017 | Kim | H01L 27/3276 |
| 2017/0302772 A1* | 10/2017 | Zhang | H05K 1/028 |
| 2017/0338294 A1* | 11/2017 | Choi | H01L 27/3276 |
| 2017/0338296 A1* | 11/2017 | Yamazaki | G04G 9/0088 |
| 2017/0371195 A1* | 12/2017 | Tomioka | H01L 51/5234 |
| 2018/0053790 A1* | 2/2018 | Kwon | G02F 1/1345 |
| 2018/0076415 A1* | 3/2018 | Chung | G09G 3/3266 |
| 2018/0301520 A1* | 10/2018 | Jin | H01L 27/3262 |
| 2019/0103569 A1* | 4/2019 | Zhai | H01L 51/5253 |
| 2019/0115417 A1* | 4/2019 | Yamazaki | H01L 27/3276 |
| 2019/0227367 A1* | 7/2019 | Tomioka | G02F 1/133305 |
| 2019/0281692 A1* | 9/2019 | Jeon | H05K 1/028 |
| 2019/0305073 A1* | 10/2019 | Chen | H05K 1/028 |
| 2019/0333982 A1* | 10/2019 | Choi | H01L 27/3276 |
| 2019/0341441 A1* | 11/2019 | Lee | H01L 51/0097 |
| 2020/0295113 A1* | 9/2020 | Lee | G02F 1/13458 |
| 2020/0312882 A1* | 10/2020 | Son | H01L 27/3276 |
| 2020/0341516 A1* | 10/2020 | Huang | G09F 9/301 |
| 2021/0280665 A1* | 9/2021 | Lee | H01L 27/3276 |

FOREIGN PATENT DOCUMENTS

| | | | |
|---|---|---|---|
| KR | 10-2017-0103048 | 9/2017 | |
| KR | 10-2017-0114040 | 10/2017 | |
| WO | WO-2016032175 A1 * | 3/2016 | H01L 27/323 |

* cited by examiner

DISPLAY APPARATUS HAVING A BENDING AREA WITH DIFFERENTLY SHAPED WIRINGS

CROSS-REFERENCE TO RELATED APPLICATION

Korean Patent Application No. 10-2018-0120605, filed on Oct. 10, 2018, in the Korean Intellectual Property Office, and entitled: "Display Apparatus," is incorporated by reference herein in its entirety.

BACKGROUND

1. Field

Embodiments relate to a display apparatus.

2. Description of the Related Art

Display apparatuses may have a display on a substrate. In the display apparatus, visibility at various angles may be improved or the area of a non-display region may be reduced by bending at least a part of the display apparatus.

SUMMARY

The embodiments may be realized by providing a display apparatus including a flexible substrate, the flexible substrate including a first area where an image is displayed, a second area separated from the first area, and a bending area between the first area and the second area; a display on the first area of the substrate; a pad on the second area of the substrate; and a plurality of wirings on the substrate, the plurality of wirings including a first wiring having a first shape; and a second wiring having a second shape that is different from the first shape, the first wiring and the second wiring passing through the bending area.

The bending area may include a first bending area that contacts the first area and has a first curvature; and a second bending area that contacts the first bending area and has a second curvature that is different from the first curvature.

The first curvature may be greater than the second curvature.

The first wiring may be on the first bending area, and the second wiring may be on the second bending area.

Each wiring of the plurality of wirings may be branched and includes a first branch wiring and a second branch wiring, the first branch wiring and the second branch wiring being on the bending area.

The first branch wiring may include a first conductive line on the first bending area and a second conductive line on the second bending area, and the second branch wiring may include a third conductive line on the first bending area and a fourth conductive line on the second bending area.

Each of the first conductive line and the third conductive line of the first wiring may have a stripe shape.

The second wiring may further include a bridge line that connects the second conductive line to the fourth conductive line.

The bridge line may be arranged in a direction crossing the second conductive line and the fourth conductive line.

The first wiring may be inclined at an angle with respect to the second wiring.

The bending area may be bent along a bending axis extending in a first direction, and the second wiring may be arranged orthogonal to the bending axis.

The second wiring may further include a bridge line that connects the second conductive line to the fourth conductive line, and the bridge line may include a first bridge line and a second bridge line that are arranged in directions crossing each other.

Each of the second conductive line and the fourth conductive line may have a portion contacting the bridge line, the portion having an inwardly recessed shape.

Each of the second conductive line and the fourth conductive line may have a portion contacting the bridge line, the portion having an outwardly rounded shape.

On a plane, the second wiring may include a hole surrounded by the second conductive line and the bridge line or surrounded by the fourth conductive line and the bridge line, the hole having a fan shape.

A same signal may be input to each of the first branch wiring and the second branch wiring.

The first wiring may have a stripe shape.

The second wiring may have a plurality of holes.

The second wiring may have a curved shape in at least a partial area thereof.

The bending area may further include a third bending area that contacts the second bending area and has a third curvature that is different from the first curvature and the second curvature, and each of the plurality of wirings may include a third wiring in the third bending area and having a third shape that is different from the first shape and the second shape.

The first curvature, the second curvature, and the third curvature may satisfy the following equation: First Curvature>Second Curvature>Third Curvature.

The second curvature may be greater than the first curvature, and the second wiring may have a stripe shape.

The first wiring may include a plurality of holes.

The bending area may be symmetrical with respect to a bending axis, and the first bending area and the second bending area may be at one side with respect to the bending axis.

The embodiments may be realized by providing a display apparatus including a substrate that includes a bending area between a first area and a second area and bent around a bending axis, the bending area including: a first curvature area bent with a first curvature; and a second curvature area between the first curvature area and each of the first area and the second area and bent with a second curvature that is different from the first curvature; a display in the first area of the substrate; and a plurality of wirings extending in a direction crossing the bending axis and passing through the bending area, each of the plurality of wirings having a first shape in the first curvature area and having a second shape that is different from the first shape in the second curvature area.

The second curvature may be greater than the first curvature, and the second shape may be a stripe shape.

The first curvature may be greater than the second curvature, and the first shape may be a stripe shape.

Each of the plurality of wirings may be branched and has a multi-wiring shape on the bending area.

Each of the plurality of wirings may further include a bridge line connecting the multi-wiring to each other in the area of the first curvature area and the second curvature area that has a smaller curvature.

Each of the plurality of wirings may include a plurality of holes in the area of the first curvature area and the second curvature area that has a smaller curvature.

Each of the plurality of wirings may have a curved shape in at least a part thereof in the area of the first curvature area and the second curvature area that has a smaller curvature.

BRIEF DESCRIPTION OF THE DRAWINGS

Features will be apparent to those of skill in the art by describing in detail exemplary embodiments with reference to the attached drawings in which.

DETAILED DESCRIPTION

Figure 1:
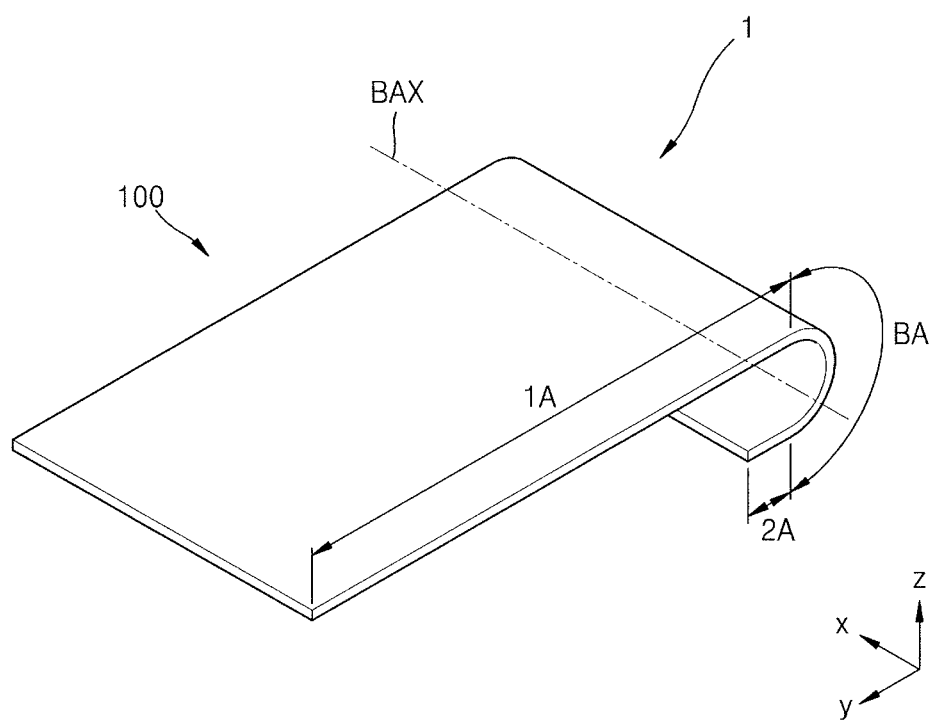
FIG. 1 illustrates a perspective view of a part of a display apparatus according to an embodiment.

Example embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey exemplary implementations to those skilled in the art.

Reference will now be made in detail to embodiments, examples of which are illustrated in the accompanying drawings, wherein like reference numerals refer to like elements throughout. In this regard, the present embodiments may have different forms and should not be construed as being limited to the descriptions set forth herein. Accordingly, the embodiments are merely described below, by referring to the figures, to explain aspects of the present description. As used herein, the terms "or" and "and/or" includes any and all combinations of one or more of the associated listed items. Expressions such as "at least one of," when preceding a list of elements, modify the entire list of elements and do not modify the individual elements of the list.

It will be understood that although the terms "first," "second," etc. may be used herein to describe various components, these components should not be limited by these terms. These components are only used to distinguish one component from another. Furthermore, as used herein, the singular forms "a," "an" and "the" are intended to include the plural forms as well, unless the context clearly indicates otherwise.

It will be understood that when a layer, region, or component is referred to as being "formed on" another layer, region, or component, it can be directly or indirectly formed on the other layer, region, or component. For example, intervening layers, regions, or components may be present.

Sizes of components in the drawings may be exaggerated for convenience of explanation. In other words, since sizes and thicknesses of components in the drawings are arbitrarily illustrated for convenience of explanation, the following embodiments are not limited thereto.

In the following examples, the x-axis, the y-axis and the z-axis are not limited to three axes of the rectangular coordinate system, and may be interpreted in a broader sense. For example, the x-axis, the y-axis, and the z-axis may be perpendicular to one another, or may represent different directions that are not perpendicular to one another.

When a certain embodiment may be implemented differently, a specific process order may be performed differently from the described order. For example, two consecutively described processes may be performed substantially at the same time or performed in an order opposite to the described order.

A display apparatus according to an embodiment is an apparatus for displaying an image and may include, e.g., a liquid crystal display apparatus, an electrophoretic display apparatus, an organic light-emitting display apparatus, an inorganic light-emitting display apparatus, a field emission display apparatus, a surface-conduction electron-emitter display apparatus, a plasma display apparatus, or a cathode ray display apparatus.

In the following description, an organic light-emitting display apparatus, e.g., is described as a display apparatus according to an embodiment. However, a variety of types of display apparatuses may be adopted.

Figure 2:
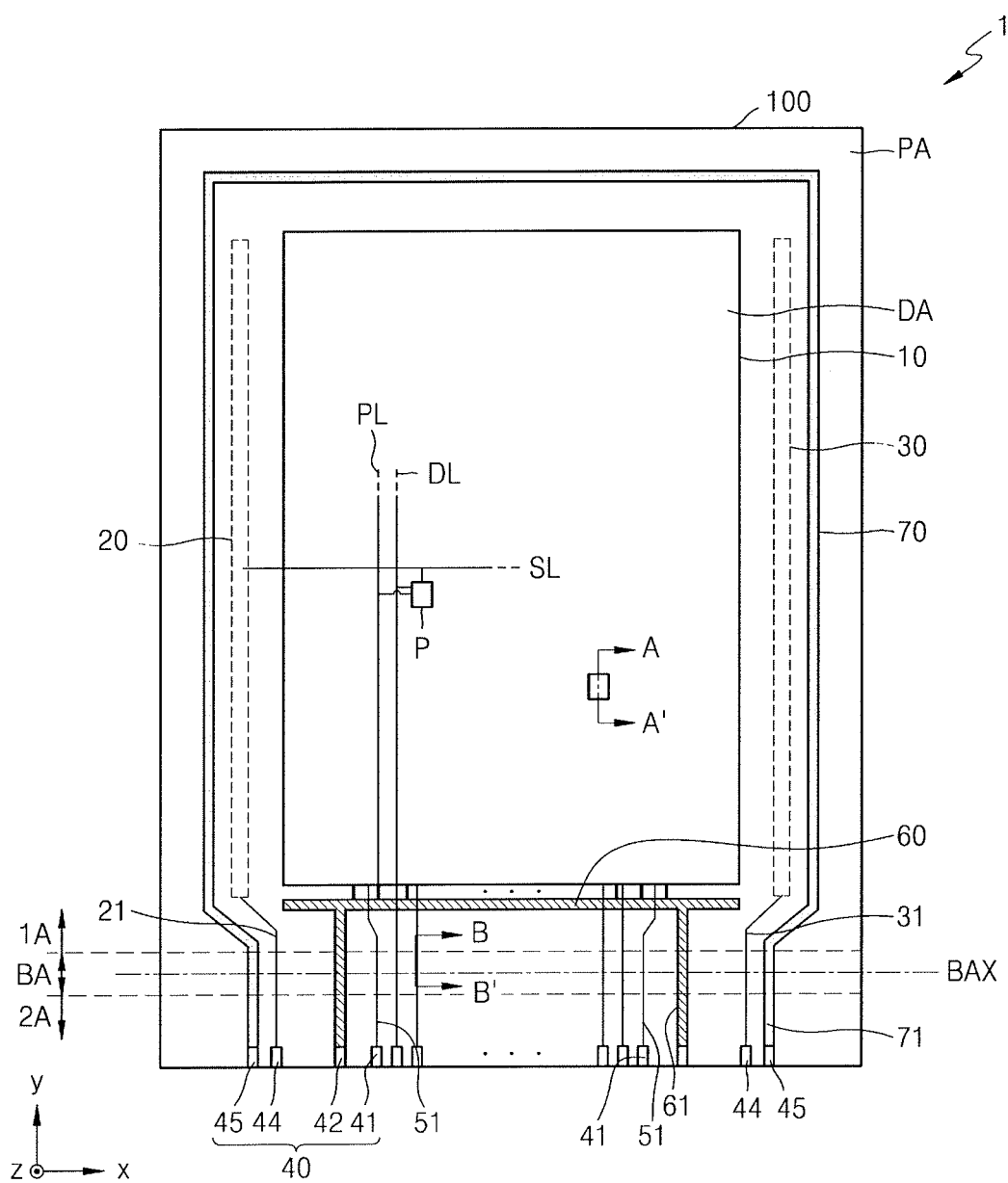
FIG. 2 illustrates a plan view of a structure of the display apparatus of FIG. 1 before bending.
Figure 2:
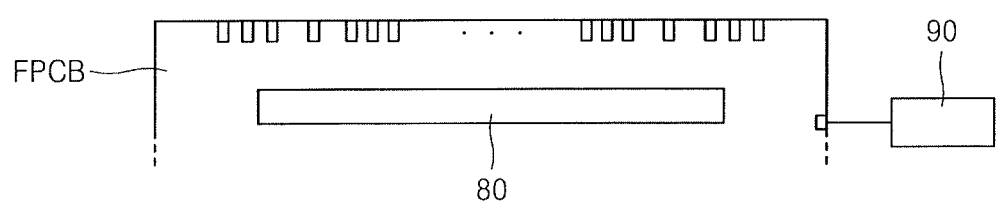

FIG. 1 illustrates a perspective view of a part of a display apparatus 1 according to an embodiment. FIG. 2 illustrates a plan view of a structure of the display apparatus 1 of FIG. 1 before bending.

Referring to FIGS. 1 and 2, the display apparatus 1 according to the present embodiment may include a substrate 100. The substrate 100 may have a bending area BA between a first area 1A and a second area 2A. The bending area BA may be between the first area 1A and the second area 2A. In an implementation, the substrate 100 may be bent with respect to or around a bending axis BAX extending in an x direction as illustrated in FIG. 1.

The substrate 100 may include various materials having flexible or bendable properties. For example, the substrate 100 may include a polymer resin such as polyethersulfone (PES), polyacrylate (PAR), polyetherimide (PEI), polyethylene naphthalate (PEN), polyethyeleneterepthalate (PET), polyphenylene sulfide (PPS), polyallylate, polyimide (PI), polycarbonate (PC), or cellulose acetate propionate (CAP).

A display area DA may be included in the first area 1A. For example, as illustrated in FIG. 2, the first area 1A may include the display area DA and a part of a peripheral area PA around the display area DA. The peripheral area PA may include the bending area BA and the second area 2A. The first area 1A and the second area 2A with the bending area BA therebetween may be located on the same plane (x-y plane).

Referring to FIG. 2, the display apparatus 1 may include a display 10 arranged on the substrate 100. The display 10 may include a plurality of pixels P that are connected to a scan line SL extending in the x direction and a data line DL extending in a y direction perpendicular to the x direction. The display 10 may provide an image through light emitted from the pixels P, and defines the display area DA.

Each pixel P may emit, e.g., red, green, blue, or white light. Each pixel P may include a display element that may include an organic light-emitting diode (OLED). In an implementation, the pixel P refers to a pixel that emits any one of the above-described red, green, blue, and white lights. The structure of the pixel P is described in detail below with respect to FIG. 3.

The peripheral area PA may be outside the display area DA. For example, the peripheral area PA may surround the display area DA. The peripheral area PA is an area where the pixels P are not arranged, and corresponds to a non-display area that does not provide an image. In an implementation, the bending area BA may be a part of the peripheral area PA, and accordingly, the bending area BA may be a non-display area that does not provide an image.

A drive circuit, e.g., first and second scan drive circuits 20 and 30, a pad structure 40, a drive power supply wiring 60, and a common power supply wiring 70 may be arranged in the peripheral area PA.

The first and second scan drive circuits 20 and 30 may be arranged in the peripheral area PA of the substrate 100, and may generate and transmit scan signals to each pixel P through the scan line SL. In an implementation, the first scan drive circuit 20 may be arranged at the left side of the display 10, and the second scan drive circuit 30 may be arranged at the right side of the display 10. In an implementation, only one scan drive circuit may be provided.

The pad structure 40 may be arranged at one end of the substrate 100, and may include a plurality of pads 41, 42, 44, and 45. The pad structure 40 may not be covered by an insulating layer to be exposed, and may be electrically connected to a flexible printed circuit substrate (FPCB). The pad structure 40 may be at one side of the substrate 100 where the first and second scan drive circuits 20 and 30 are not located.

The FPCB electrically connects a controller 90 and the pad structure 40, and the signal or power transmitted from the controller 90 may be transmitted to connection wirings 21, 31, 51, 61, and 71 connected to the pad structure 40.

The controller 90 receives a vertical sync signal, a horizontal sync signal, and a clock signal and generates a control signal to control driving of the first and second scan drive circuits 20 and 30. The generated signals may be transmitted to each of the first and second scan drive circuits 20 and 30 through the pads 44, which are connected to the FPCB, and the connection wirings 21 and 31. The scan signals of the first and second scan drive circuits 20 and 30 may be provided to each pixel P through the scan line SL. The controller 90 provides drive power ELVDD and common power ELVSS respectively to the drive power supply wiring 60 and the common power supply wiring 70 through the pads 42 and 45, which are connected to the FPCB, and the connection wirings 61 and 71. The drive power ELVDD may be provided to each pixel P through a drive voltage line PL, and the common power ELVSS may be provided to a common electrode of the pixel P.

A data drive circuit 80 may be arranged on the FPCB. The data drive circuit 80 provides a data signal to each pixel P. The data signal of the data drive circuit 80 is provided to each pixel P through the connection wiring 51 connected to the pad 41 and the data line DL connected to the connection wiring 51. In an implementation, as illustrated in FIG. 2, the data drive circuit 80 may be arranged on the FPCB. In an implementation, the data drive circuit 80 may be arranged in the peripheral area PA of the substrate 100.

The drive power supply wiring 60 may be arranged in the peripheral area PA. For example, the drive power supply wiring 60 may be arranged between one side of the display 10 adjacent to the pad structure 40. The drive power ELVDD provided through the connection wiring 61 connected to the pad 41 may be provided to each of the pixels P through the drive voltage line PL.

The common power supply wiring 70 may be arranged in the peripheral area PA, and may partially surround the display 10. For example, the common power supply wiring 70 has a loop shape in which one side of the display 10 adjacent to the pad structure 40 is open, and may extend along an edge of the substrate 100 except the pad structure 40.

The common power supply wiring 70 of FIG. 2 is electrically connected to the connection wiring 71 connected to the pad 45, and provides the common power ELVSS to a counter electrode 330, e.g., a cathode (see FIG. 14), of the OLED of the pixel P. In FIG. 2, the common power supply wiring 70 partially surrounds the display 10 in the form of a loop having one open side, and the connection wiring 71 and the common power supply wiring 70 are integrally formed.

In an implementation, a thin film encapsulation portion for encapsulating the display 10 from the outside may be further provided on the display 10. The thin film encapsulation portion may be provided as a multilayer in which an inorganic layer and an organic layer are alternately stacked. The thin film encapsulation portion may cover, including the display 10, circuit portions, e.g., the first and second scan drive circuits 20 and 30 and the common power supply wiring 70, which are arranged in the peripheral area PA, and extend toward the edge of the substrate 100.

Figure 3:
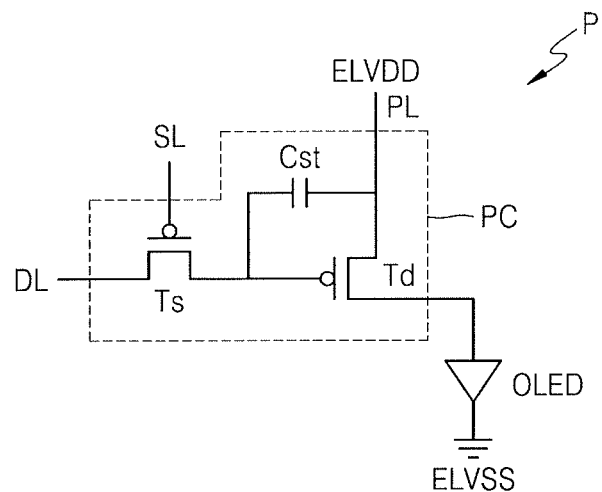
FIG. 3 illustrates an equivalent circuit diagram of any one pixel of the display apparatus of FIG. 1.

FIG. 3 illustrates an equivalent circuit diagram of any one pixel of the display apparatus 1 of FIG. 1.

Referring to FIG. 3, the pixel P may include a pixel circuit PC connected to the scan line SL and the data line DL and the OLED connected to the pixel circuit PC. The pixel circuit PC may include a driving thin film transistor Td, a switching thin film transistor Ts, and a storage capacitor Cst. The switching thin film transistor Ts is connected to the scan line SL and the data line DL, and transmits, to the driving thin film transistor Td, a data signal input through the data line DL in response to a scan signal input through the scan line SL.

The storage capacitor Cst is connected to the switching thin film transistor Ts and the drive voltage line PL, and stores a voltage corresponding to a difference between a voltage received from the switching thin film transistor Ts and a drive voltage ELVDD supplied to the drive voltage line PL.

The driving thin film transistor Td is connected to the drive voltage line PL and the storage capacitor Cst, and may control a drive current flowing from the drive voltage line PL toward the OLED in response to a value of the voltage stored in the storage capacitor Cst. The OLED may emit light having certain brightness by the drive current. The OLED may emit, for example, a red, green, blue, or white light.

In an implementation, as illustrated in FIG. 3, the pixel P may include two thin film transistors and one storage thin film transistor. In an implementation, the pixel circuit PC of the pixel P may be variously modified to include three or more thin film transistors or two or more storage thin film transistors.

Referring back to FIG. 2, the connection wirings 21, 31, 51, 61, and 71 may be located across the first area 1A, the bending area BA, and the second area 2A, parts of the connection wirings 21, 31, 51, 61, and 71 may pass through the bending area BA. The bending area BA may be bent with respect to a bending axis BAX, as illustrated in FIG. 1. When the bending area BA is bent with respect to the bending axis BAX, defects (such as short-circuits) could occur as stress concentrates on the connection wirings 21, 31, 51, 61, and 71 arranged on the bending area BA.

According to an embodiment, the display apparatus may have a structure that is strong against stress and also provides a bypass if a crack were to be generated in a particular part of a plurality of wirings through shape deformation of a plurality of wirings in the bending area BA, thereby preventing complete short-circuits of the wirings.

Figure 4:
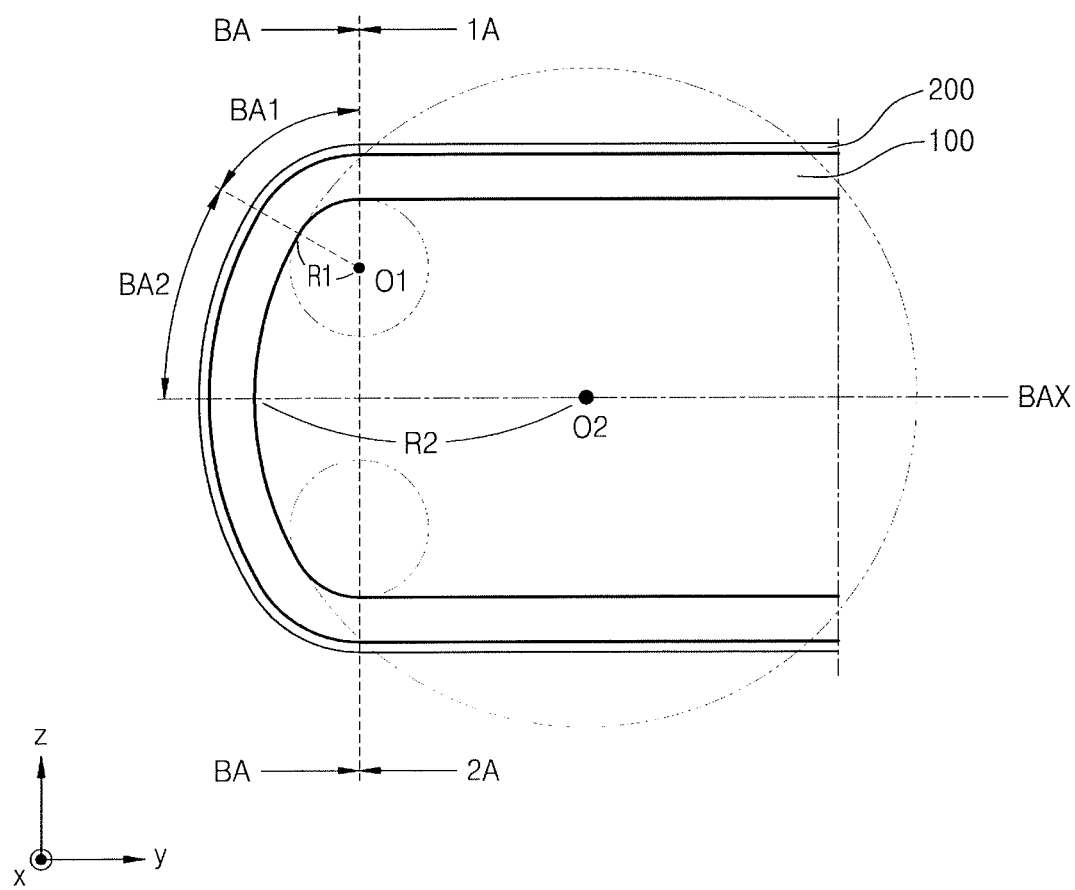
FIG. 4 illustrates a side view of a bending area of the display apparatus of FIG. 1.
Figure 5:
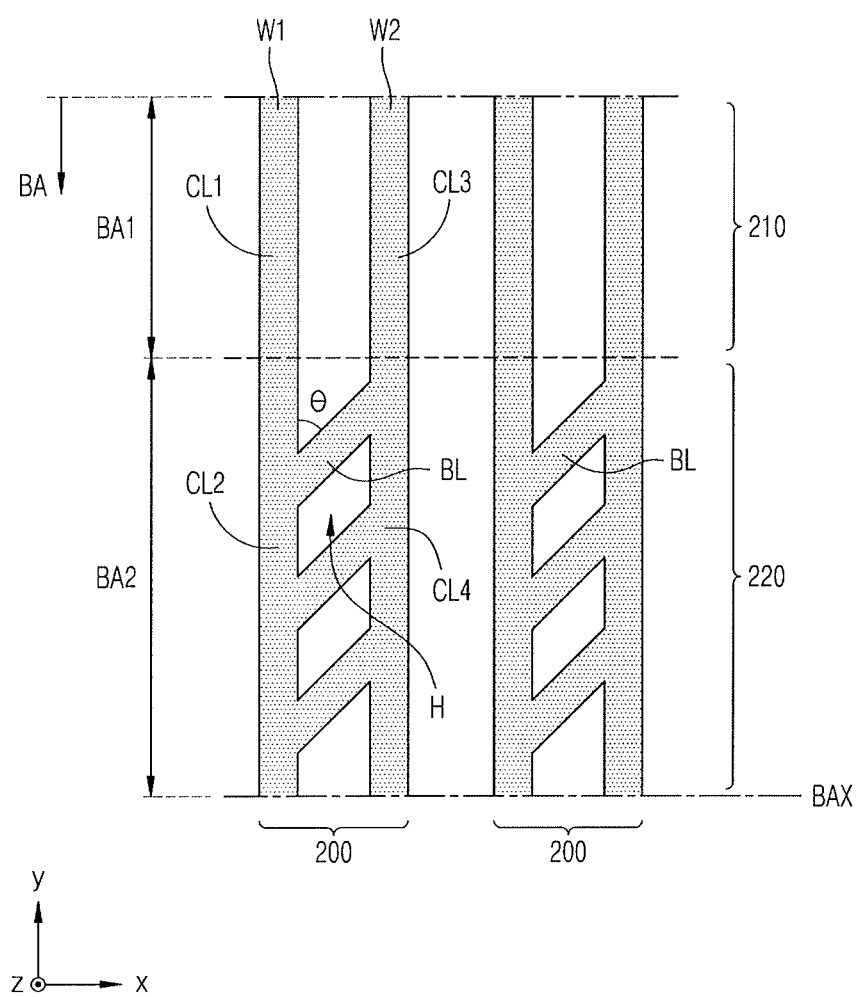
FIG. 5 illustrates a plan view of a part of the bending area of the display apparatus of FIG. 1.

FIG. 4 illustrates a side view of the bending area BA of the substrate 100 of the display apparatus 1 of FIG. 1. FIG. 5 illustrates a plan view of a part of the bending area BA of the substrate 100 of the display apparatus 1 of FIG. 1.

Referring to FIG. 4, the substrate 100 according to the present embodiment may include the first area 1A, the bending area BA, and the second area 2A, which are sequentially arranged. Wirings 200 may be arranged or may extend across the first area 1A, the bending area BA, and the second area 2A. In the embodiments including those illustrated in FIGS. 4 and 5, the wirings 200 may be at least one of the above-described connection wirings 21, 31, 51, 61, and 71. In an implementation, the wirings 200 may be a suitable wiring arranged across the bending area BA.

When an actual product is implemented, the bending area BA of the substrate 100 may be bent forming a curved surface with respect to the bending axis BAX. However, the bending area BA may not be bent with the same curvature in the entire area of the bending area BA, which may actually be impossible. For example, the bending area BA may be bent with a relatively large curvature in one area thereof and with a relatively small curvature in another area thereof.

In an implementation, the bending area BA may include a first bending area BA1 and a second bending area BA2, which are bent with different curvatures. The first bending area BA1 may be bent with a first curvature, and the second bending area BA2 may be bent with a second curvature that is different from the first curvature. In an implementation, the first curvature may be greater than the second curvature. This means that a radius of curvature R1 of the first bending area BA1 may be smaller than a radius of curvature R2 of the second bending area BA2.

In an implementation, as illustrated in FIG. 4, the first bending area BA1 and the second bending area BA2 may be arranged approximately symmetrically with respect to (e.g., on either side of) the bending axis BAX. In an implementation, the first bending area BA1 and the second bending area BA2 having different curvatures may be a part or the whole of the bending area BA, and may not necessarily be symmetric.

The first bending area BA1 may contact, extend from, or be directly adjacent to the first area 1A, and the second bending area BA2 may contact, extend from, or be directly adjacent to the first bending area BA1. The first area 1A, the first bending area BA1, and the second bending area BA2 may be sequentially arranged.

In an implementation, the first bending area BA1 may contact the second area 2A, and the second bending area BA2 may contact the first bending area BA1. For example, the second area 2A, the first bending area BA1, and the second bending area BA2 may be sequentially arranged. In an implementation, the first bending area BA1 may be in contact with the first area 1A and the second area 2A that are formed as a plane, a force may concentrate on the first bending area BA1 during bending, and the first bending area BA1 may be bent with a relatively large curvature compared to the second bending area BA2. A part of a wiring in the first bending area BA1 and bent with a relatively large curvature may receive or be subject to a greater amount of stress than that of a part of a wiring in the second bending area BA2. This means that a probability of occurrence of defects such as cracks and short-circuits could be higher.

In an implementation, as illustrated in FIG. 5, as the shapes of the wirings 200 are implemented to be different from each other according to the curvatures of the bending area BA, an area that is bent with a relatively large curvature and thus stress concentrates thereon may have a shape that is strong against stress, and an area that is bent with a relatively small curvature and thus stress is reduced may have a multi-wiring shape that reduces electrical short-circuits in the bending area. Thus, the wirings 200 may have an optimal shape that is strong against stress (e.g., or compensates for errors or breakages that result therefrom).

Referring to FIG. 5, each of the wirings 200 may include a first wiring 210 having a first shape in the first bending area BA1 and a second wiring 220 having a second shape in the second bending area BA2. As illustrated in FIG. 5, the first shape and the second shape may be different from each other.

Each of the wirings 200 may have a multi-wiring shape in the bending area BA. For example, each of the wirings 200 is branched and includes a first branch wiring W1 and a second branch wiring W2, which are located in the bending area BA. The first branch wiring W1 may include a first conductive line CL1 corresponding to, on, or in the first bending area BA1 and a second conductive line CL2 on the second bending area BA2. The second branch wiring W2 may include a third conductive line CL3 on the first bending area BA1 and a fourth conductive line CL4 on the second bending area BA2.

The first wiring 210 on the first bending area BA1 may include the first conductive line CL1 and the third conductive line CL3. The second wiring 220 on the second bending area BA2 may include the second conductive line CL2 and the fourth conductive line CL4.

In an implementation, as illustrated in FIG. 5, each of the wirings 200 may include two branch wirings W1 and W2. In an implementation, each of the wirings 200 may include three or more branch wirings. As such, as each of the wirings 200 may include the first and second branch wirings W1 and W2 on the bending area BA, a bypass for electrical connection may be provided when cracks and short-circuits occur due to the stress applied to the bending area BA.

Stress may concentrate on the first bending area BA1 that is bent with a relatively large curvature compared to the second bending area BA2, and the first bending area BA1 may have a structure that is strong against stress. The first wiring 210 may have a stripe shape. For example, the first conductive line CL1 and the third conductive line CL3 may have a stripe shape. In an implementation, the first wiring 210 may be implemented in various shapes, and a stripe shape may be the strongest against stress. A stripe shape may be characteristically strong against stress as the stress may be uniformly distributed in the entire area on a plane regardless of a recessed portion or a protruding portion. In an implementation, the first wiring 210 (that is bent with a relatively large curvature) may have a stripe shape that is strong against stress.

The second bending area BA2 (that is bent with a relatively small curvature compared to the first bending area BA1) may be less stressed, and the wiring on the second bending area BA2 may have a shape that is relatively less strong against stress while reducing electrical short-circuits. In an implementation, the second wiring 220 may have a ladder shape. A ladder shape may denote that the second wiring 220 may include a plurality of bridge lines BL that connect the second and fourth conductive lines CL2 and CL4 to each other.

In this case, for efficient stress reduction, the bridge lines BL may be arranged in a direction crossing the second and fourth conductive lines CL2 and CL4. For example, the bridge lines BL may be arranged obliquely at an angle θ with respect to the second and fourth conductive lines CL2 and CL4. In an implementation, the angle θ may be, e.g., about 45°. In an implementation, the angle may be varied according to design.

In an implementation, the bridge lines BL may be arranged in a zigzag, and not in the same direction as illustrated in FIG. 5.

The second wiring 220 may have the same effect as having a plurality of holes H through the second and fourth conductive lines CL2 and CL4 and the bridge lines BL. For example, the second wiring 220 may include the holes H, and each of the holes H may be defined by the second and fourth conductive lines CL2 and CL4 and the bridge lines BL. In an implementation, as illustrated in FIG. 5, each of the holes H may have a parallelogram shape. In an implementation, each of the holes H may have various shapes, e.g., a circle, an oval, and a polygon, or a part thereof.

Figure 6:
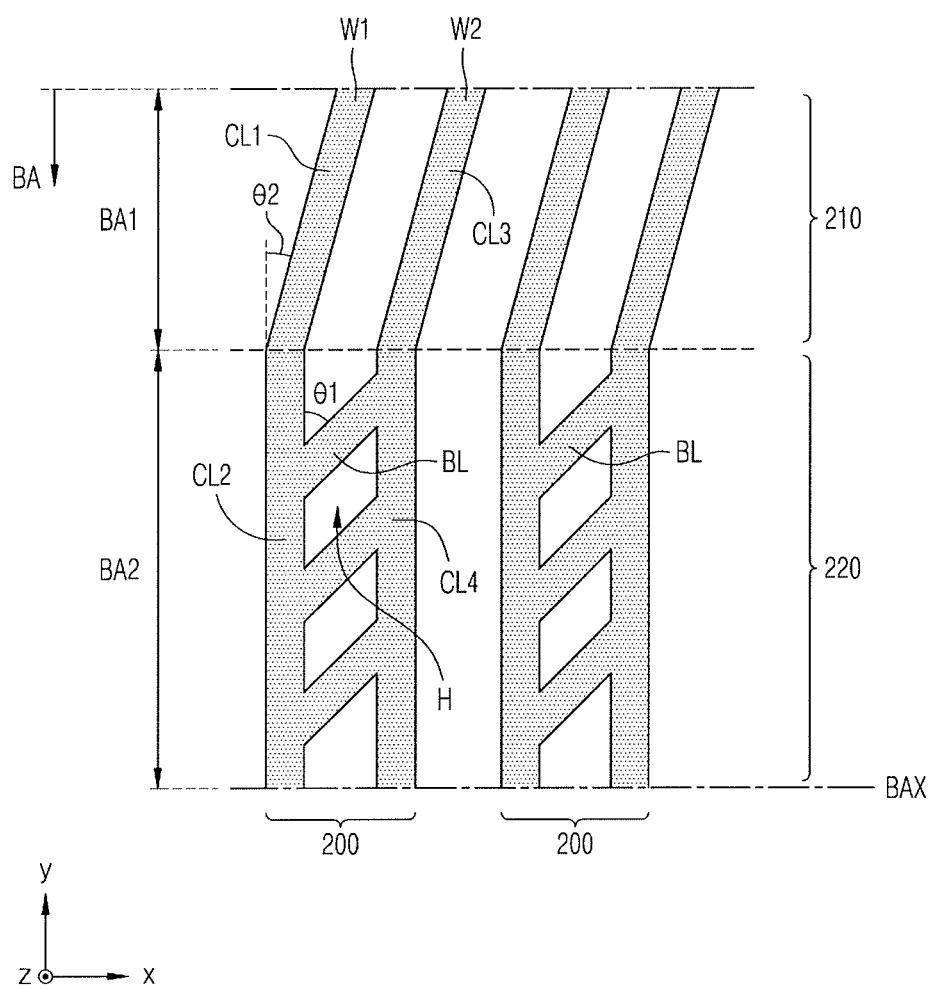
FIG. 6 illustrates a plan view of another embodiment of FIG. 5.

FIG. 6 illustrated a plan view of another embodiment of FIG. 5.

The embodiment of FIG. 6 is different from the embodiment of FIG. 5 in the first wiring 210. The structure of the embodiment of FIG. 6, except the first wiring 210, is the same as that of the embodiment of FIG. 5. In the following description, only differences therebetween are described and redundant descriptions may be omitted.

Referring to FIG. 6, the first wiring 210 may be bent or inclined at an angle θ2 with respect to the second wiring 220. In this regard, the bending with respect to the second wiring 220 may be interpreted to be bent with respect to the second and fourth conductive lines CL2 and CL4 of the second wiring 220.

The first conductive line CL1 and the second conductive line CL2 may be integrally formed forming the first branch wiring W1, and the second conductive line CL2 may be orthogonal to the bending axis BAX. Accordingly, the first conductive line CL1 may be bent or inclined at the angle θ2 with respect to the second conductive line CL2. Likewise, the third conductive line CL3 and the fourth conductive line CL4 may be integrally formed forming the second branch wiring W2, and the fourth conductive line CL4 may be orthogonal to the bending axis BAX. Accordingly, the third conductive line CL3 may be bent or inclined at the angle θ2 with respect to the fourth conductive line CL4.

The angle θ2 at which the first wiring 210 is bent may be selected by considering an interval and a pitch between the wirings 200. In an implementation, the angle θ2 between the inclined first conductive line CL1 and the second conductive line CL2 may be less than the angle θ1 between the bridge lines BL and the second conductive line CL2.

The second and fourth conductive lines CL2 and CL4 of the second wiring 220 may be roughly orthogonal to the bending axis BAX, and the first wiring 210 may cross the bending axis BAX, but not to be orthogonal thereto. As illustrated in FIG. 6, the first wiring 210, e.g., the first and third conductive line CL1 and CL3, may form an acute angle with respect to the bending axis BAX, and the stress applied to the first bending area BA1 that is bent with a relatively large curvature compared to the second bending area BA2 may be reduced.

Figure 7:
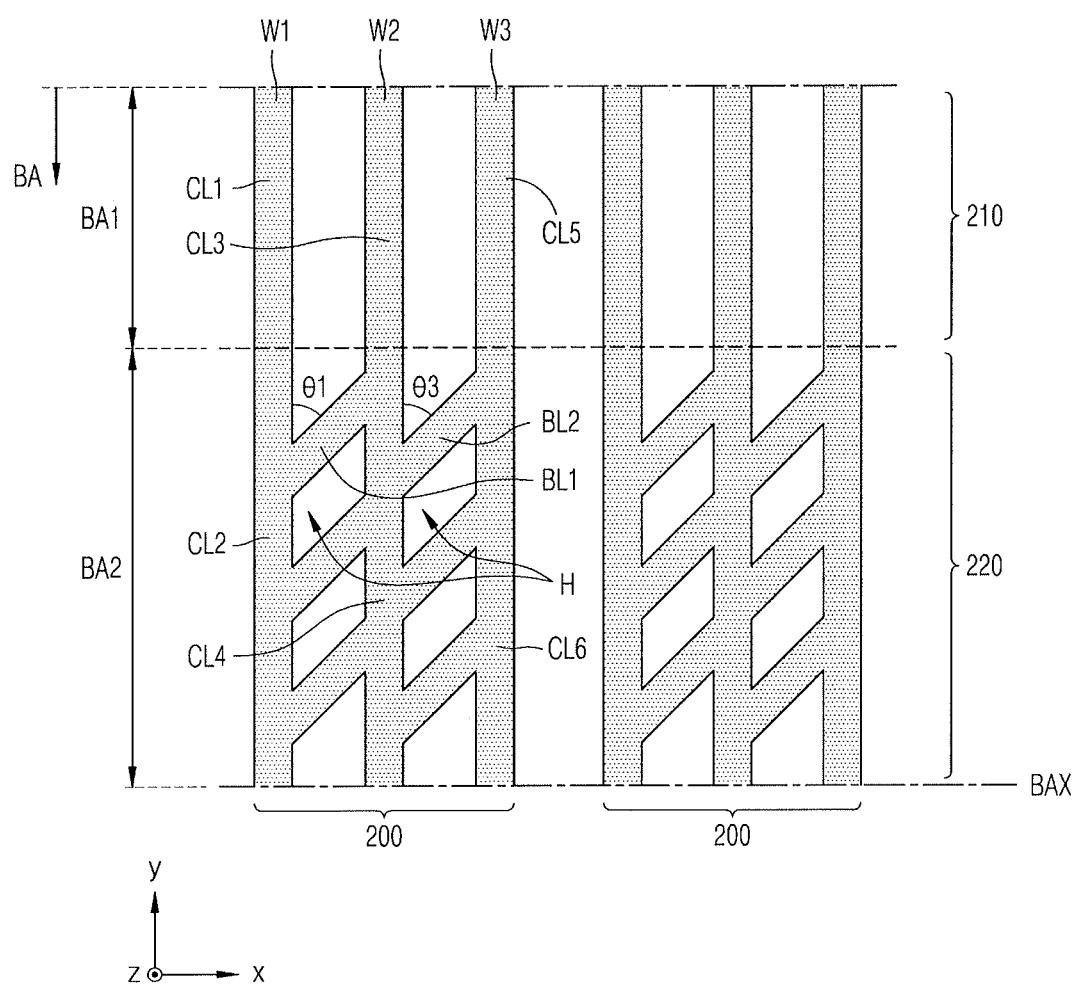
FIG. 7 illustrates a plan view of another embodiment of FIG. 5.
Figure 8:
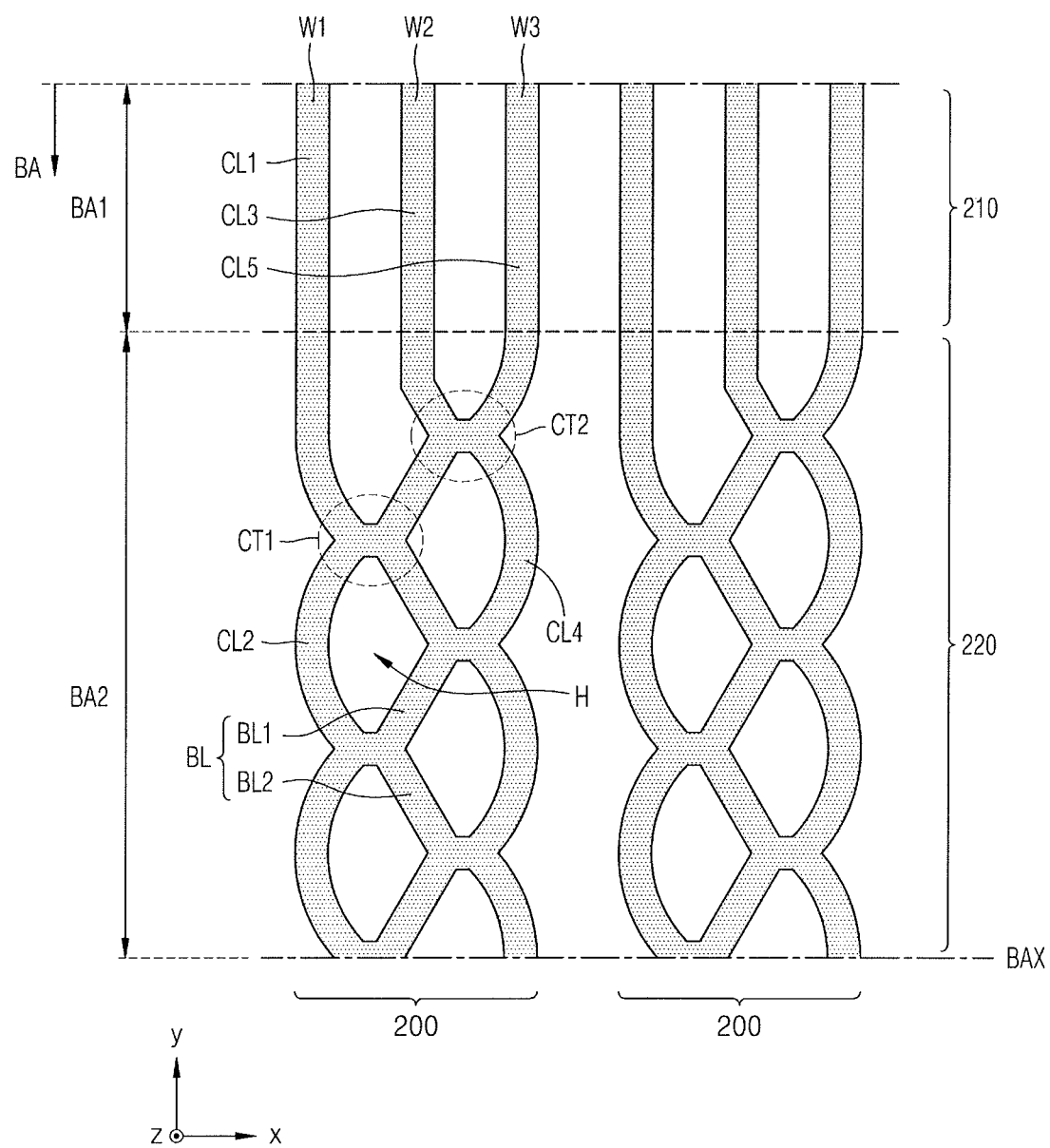
FIG. 8 illustrates a plan view of another embodiment of FIG. 5.

FIGS. 7 and 8 illustrate plan views of other embodiments of FIG. 5.

The embodiments of FIGS. 7 and 8 are different from the embodiment of FIG. 5 in the number of the branch wirings W1, W2, and W3. For example, while the above-described embodiments of FIGS. 5 and 6 include two branch wirings W1 and W2, the embodiments of FIGS. 7 and 8 include three branch wirings W1, W2, and W3. In an implementation, each of the wirings 200 may include four or more branch wirings.

Referring first to FIG. 7, the structure of the embodiment of FIG. 7 is the same as the embodiment of FIG. 5, except the number of the branch wirings W1, W2, and W3. In the following description, only differences are mainly described and redundant descriptions may be omitted.

Each of the wirings 200 may include the first, second, and third branch wirings W1, W2, and W3. The first branch wiring W1 may include the first and second conductive lines CL1 and CL2, the second branch wiring W2 may include the third and fourth conductive lines CL3 and CL4, and the third branch wiring W3 may include fifth and sixth conductive lines CL5 and CL6. The first, third, and fifth conductive lines CL1, CL3, and CL5 may be on the first bending area BA1, and the second, fourth, and sixth conductive lines CL2, CL4, and CL6 may be on the second bending area BA2. For example, the first wiring 210 on the first bending area BA1 may include the first, third, and fifth conductive lines CL1, CL3, and CL5, and the second wiring 220 on the second bending area BA2 may include the second, fourth, and sixth conductive lines CL2, CL4, and CL6.

The second wiring 220 may further include first and second bridge lines BL1 and BL2. The first bridge line BL1 may connect the second and fourth conductive lines CL2 and CL4 to each other, and the second bridge line BL2 may connect the fourth and sixth conductive lines CL4 and CL6 to each other. Like the above-described embodiment, for efficient stress reduction, the first and second bridge lines BL1 and BL2 may be arranged in a direction crossing the second and fourth conductive lines CL2 and CL4. For example, each of the first and second bridge lines BL1 and BL2 may be obliquely arranged with respect to the second, fourth, and sixth conductive lines CL2, CL4, and CL6 at angles θ1 and θ3. In an implementation, the angles θ1 and θ3 may be identical to each other, e.g., about 45°. In an implementation, the angles θ1 and θ2 may be different from each other.

Referring to FIG. 8, FIG. 8 is different from FIG. 7 in the shape of the second wiring 220.

In FIG. 8, the second wiring 220 may have a chain shape in which straight lines and curved lines are mixed. In an implementation, the second wiring 220 may include the holes H, and the holes H may have a fan shape. The shape of a plane of each of the holes H may be a fan shape formed by two straight lines having ends contacting each other at an angle and a curved line connecting the other ends of the two straight lines. In an implementation, the shape of the plane of each of the holes H may have a shape of a figure formed by a curved line and a straight line. For example, the shape of the plane of each of the holes H may be a polygon, a circle, an oval, or a part thereof.

For example, the second wiring 220 may include the bridge lines BL that connect, in a zigzag shape, the second and fourth conductive lines CL2 and CL4 and the second and fourth conductive lines CL2 and CL4. The bridge lines BL may include the first and second bridge lines BL1 and BL2. The first and second bridge lines BL1 and BL2 may be arranged in directions crossing each other, forming an angle therebetween, and may have a zigzag shape.

The first and second bridge lines BL1 and BL2 may include first and second contact portions CT1 and CT2 that respectively contact the second and fourth conductive lines CL2 and CL4. The second and fourth conductive lines CL2 and CL4 may respectively have an inwardly recessed shape at the first and second contact portions CT1 and CT2. For example, the second and fourth conductive lines CL2 and CL4 may respectively have an outwardly rounded shape at the first and second contact portions CT1 and CT2.

The second wiring 220 may have the holes H, and each of the holes H may be defined by a part of the second conductive line CL2 and the first and second bridge lines BL1 and BL2, and by a part of the fourth conductive line CL4 and the first and second bridge lines BL1 and BL2. In an implementation, the shape of each of the holes H may be variously modified.

Figure 9:
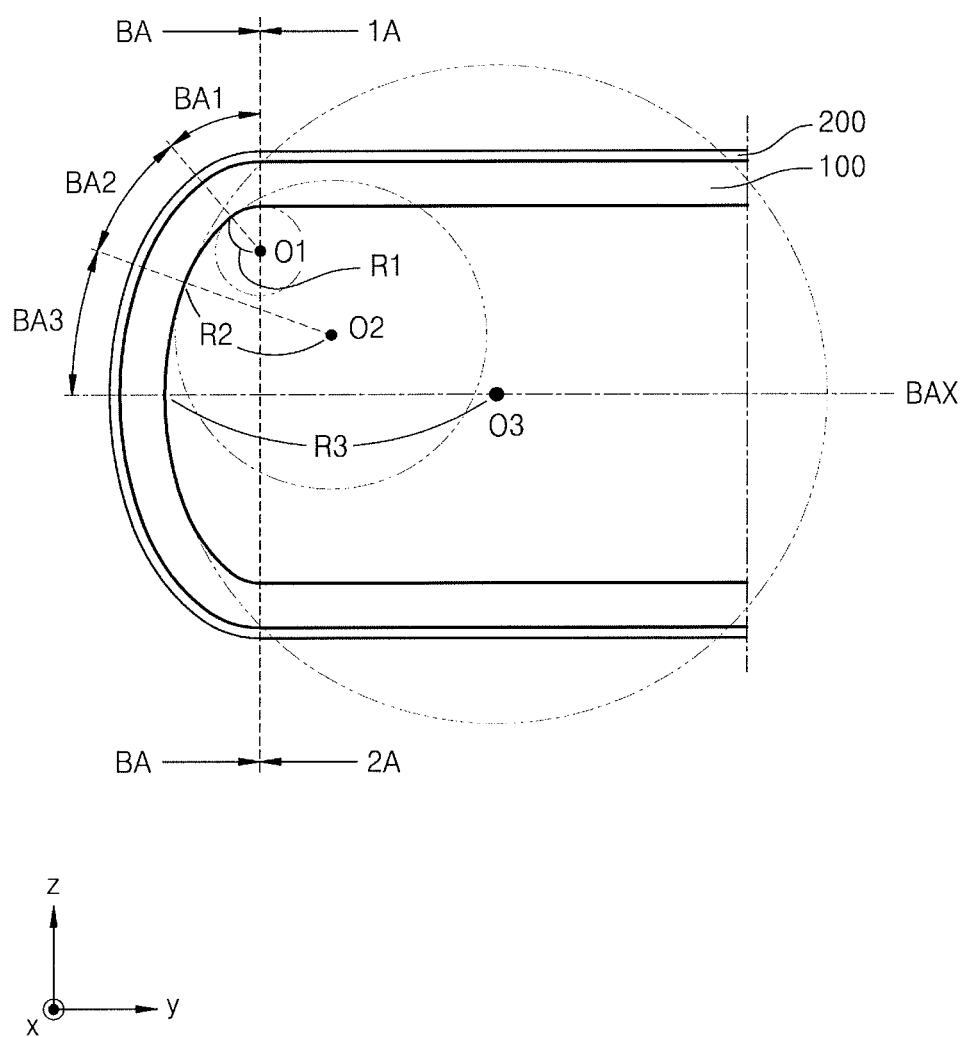
FIG. 9 illustrates a side view of a bending area of a display apparatus according to another embodiment.
Figure 10:
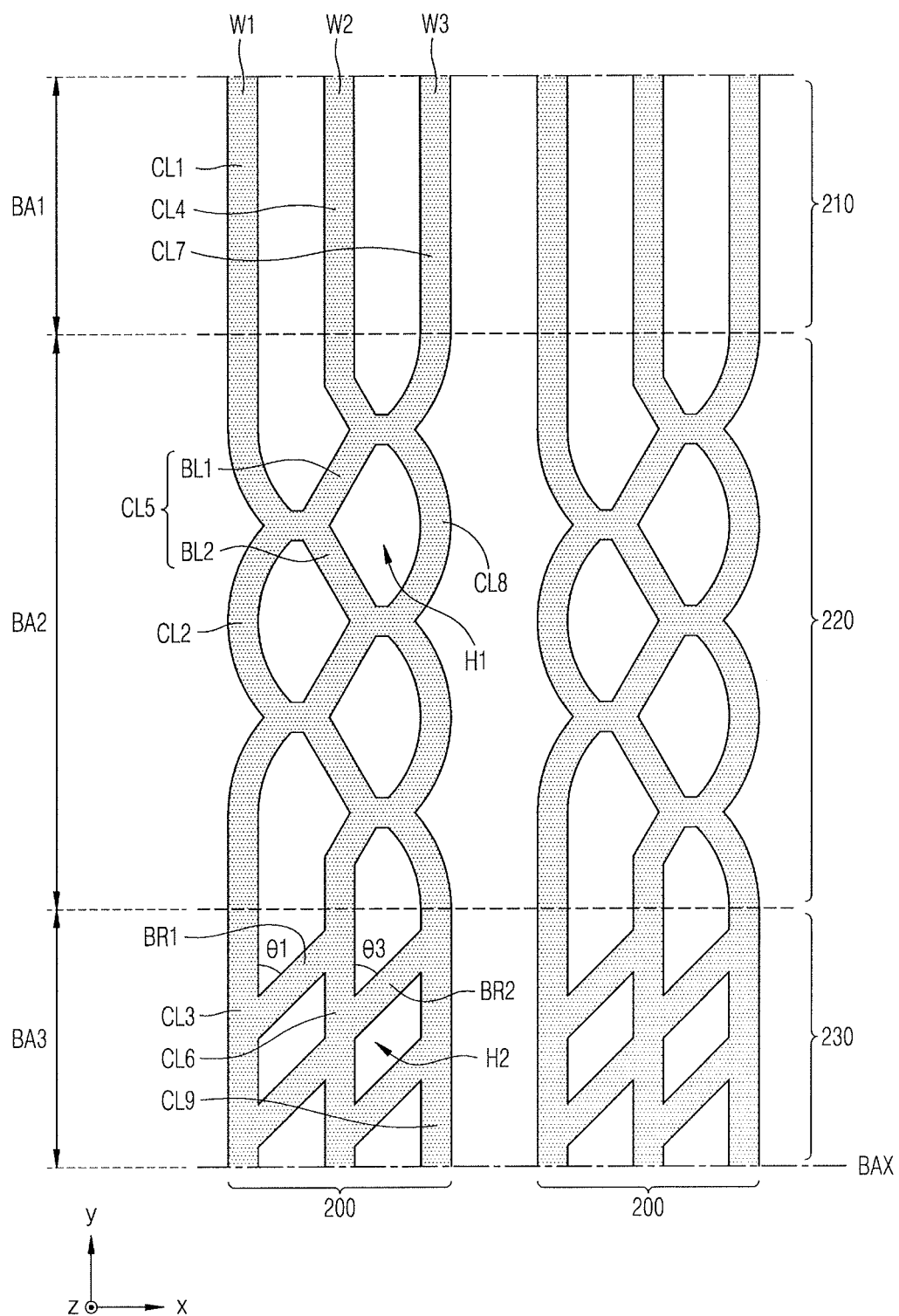
FIG. 10 illustrates a plan view of a part of the bending area of the display apparatus of FIG. 9.

FIG. 9 illustrates a side view of a bending area of a display apparatus according to another embodiment. FIG. 10 illustrates a plan view of a part of the bending area of the display apparatus of FIG. 9.

In FIGS. 9 and 10, the bending area BA may include three or more areas having curvatures that are different from one another. In the following description, only differences from the above-described embodiments are mainly described and redundant descriptions may be omitted.

Referring to FIG. 9, the substrate 100 according to the present embodiment may include the first area 1A, the bending area BA, and the second area 2A, which are sequentially arranged. The wirings 200 may be arranged across the first area 1A, the bending area BA, and the second area 2A.

In FIG. 9, the bending area BA of the substrate 100 may include the first bending area BA1, the second bending area BA2, and a third bending area BA3, which have a continuously changing curvature. The first bending area BA1 may be bent with a first curvature, the second bending area BA2 may be bent with a second curvature, and the third bending area BA3 may be bent with a third curvature. In an implementation, the first, second, and third curvatures may satisfy the following equation.

First Curvature>Second Curvature>Third Curvature (or alternatively stated First Radius of Curvature($R1$)<Second Radius of Curvature ($R2$)<Third Radius of Curvature ($R3$)).

For example, the first bending area BA1 may be bent with the greatest curvature (i.e., a bending having the smallest radius of curvature), the second bending area BA2 may be bent at another curvature, and the third bending area BA3 may be bent with the smallest curvature (i.e., a bending having the largest radius of curvature). This means that the radius of curvature R1 of the first bending area BA1 may be less than the radius of curvature R2 of the second bending area BA2, and the radius of curvature R2 of the second bending area BA2 may be less than the radius of curvature R3 of the third bending area BA3. For example, the radii of curvature R1, R2, and R3 may satisfy the following equation.

Radius of Curvature $R1$>Radius of Curvature $R2$>Radius of Curvature $R3$

In an implementation, as illustrated in FIG. 9, the first, second, and third bending areas BA1, BA2, and BA3 may be arranged approximately symmetrically with respect to the bending axis BAX. In an implementation, it is sufficient that the first, second, and third bending areas BA1, BA2, and BA3 having different curvatures constitute a part of the whole of the bending area BA, and the first, second, and third bending areas BA1, BA2, and BA3 may not necessarily be symmetric.

Referring to FIG. 10, each of the wirings 200 may include the first wiring 210 having a first shape on the first bending area BA1, the second wiring 220 having a second shape on the second bending area BA2, and a third wiring 230 having a third shape on the third bending area BA3. As illustrated in FIG. 10, the first shape, the second shape, and the third shape may be different from one another.

Each of the wirings 200 may have a multi-wiring shape on the bending area BA. For example, each of the wirings 200 may be branched and may include the first branch wiring W1, the second branch wiring W2, and the third branch wiring W3, which are on the bending area BA. The first branch wiring W1 may include the first conductive line CL1 on the first bending area BA1, the second conductive line CL2 on the second bending area BA2, and the third conductive line CL3 on the third bending area BA3. The second branch wiring W2 may include the fourth conductive line CL4 on the first bending area BA1, the fifth conductive line CL5 on the second bending area BA2, and the sixth conductive line CL6 on the third bending area BA3. The third branch wiring W3 may include a seventh conductive line CL7 on the first bending area BA1, an eighth conductive line CL8 on second bending area BA2, and a ninth conductive line CL9 on third bending area BA3.

The first wiring 210 on the first bending area BA1 may include the first conductive line CL1, the fourth conductive line CL4, and the seventh conductive line CL7. The second wiring 220 on the second bending area BA2 may include the second conductive line CL2, the fifth conductive line CL5, and the eighth conductive line CL8. The third wiring 230 on the third bending area BA3 may include the third conductive line CL3, the sixth conductive line CL6, and the ninth conductive line CL9.

The first bending area BA1 may be bent with a relatively large curvature compared to the second and third bending areas BA2 and BA3 and thus stress concentrates thereon, and may have a structure strong against stress. In an implementation, the first wiring 210 may have a stripe shape. For example, the first, fourth, and seventh conductive lines CL1, CL4, and CL7 may have a stripe shape.

The first wiring 210 may be implemented in various shapes, and the stripe shape has been experimentally determined to be the strongest against stress. The stripe shape may be characteristically strong against stress as the stress may be uniformly distributed in the entire area on a plane regardless of a recessed portion or a protruding portion. In an implementation, the first wiring 210 that is bent with a relatively large curvature may have a stripe shape that is strong against stress.

The second and third bending areas BA2 and BA3 that are bent with a relatively small curvature compared to the first bending area BA1 may be less stressed, and the second and third bending areas BA2 and BA3 may have a shape that is relatively less strong against stress while reducing electrical short-circuits.

In an implementation, the second wiring 220 may have a chain shape. At least a part of each of the second and eighth conductive lines CL2 and CL8 may be formed by a curved line. The fifth conductive line CL5 may include the first and second bridge lines BL1 and BL2 such that the second and eighth conductive lines CL2 and CL8 may be connected in a zigzag shape. The shape of the second wiring 220 of FIG. 10 is the same as the shape of the second wiring 220 of FIG. 8, and the description of FIG. 8 in this regard is used.

In an implementation, the third wiring 230 may have a ladder shape. The third wiring 230 may include the third, sixth, and ninth conductive lines CL3, CL6, and CL9, which have a stripe shape, and may include the first bridge line BR1 connecting the third and sixth conductive lines CL3 and CL6 to each other and the second bridge line BR2 connecting the sixth and ninth conductive lines CL6 and CL9 to each other. The shape of the third wiring 230 of FIG. 10 is the same as the shape of the second wiring 220 of FIG. 7, and the description of FIG. 7 is used.

As described above, the first, second, and third wirings 210, 220, and 230 may have different shapes, and each of the second and third wirings 220 and 230 may have a plurality of first and second holes H1 and H2. The second and third wirings 220 and 230 may have different shapes, and the first holes H1 of the second wiring 220 and the second holes H2 of the third wiring 230 may have different shapes. In an implementation, the first holes H1 of the second wiring 220 may have a fan shape, and the second holes H2 of the third wiring 230 may have a parallelogram shape. In an implementation, the first and second holes H1 and H2 may have various shapes.

Figure 11:
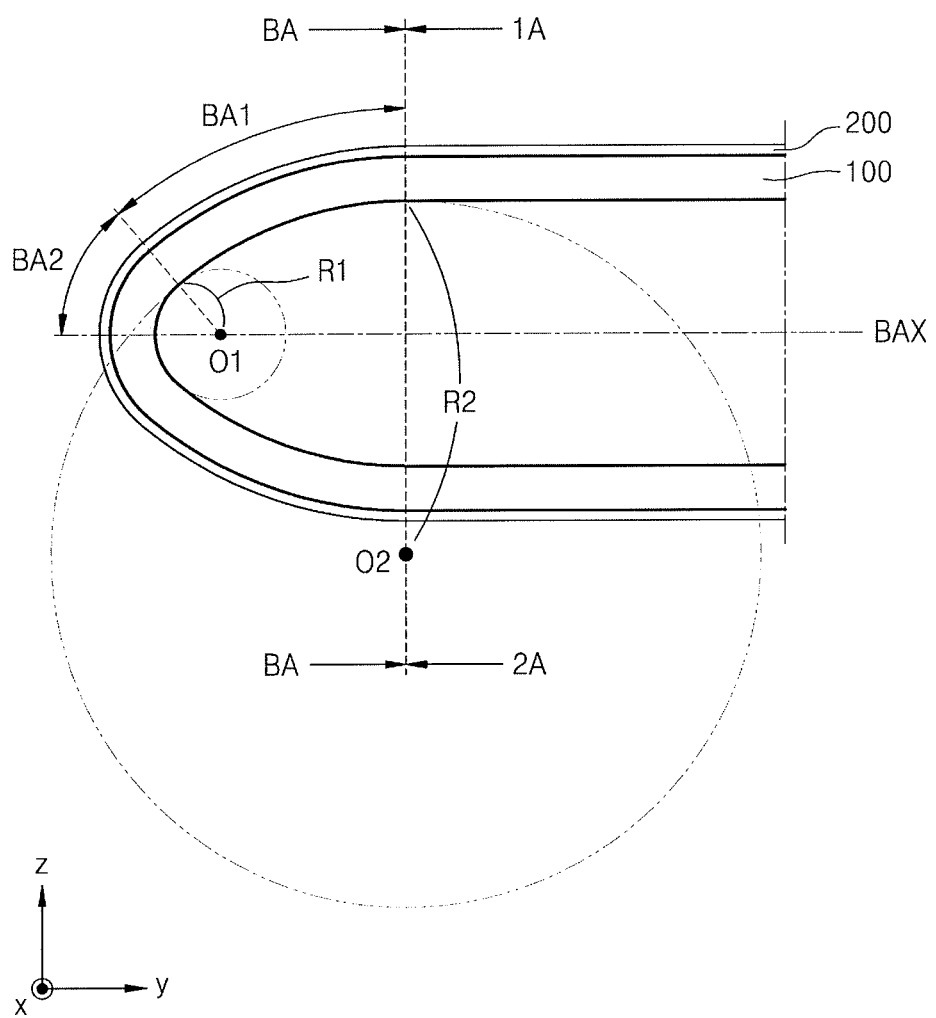
FIG. 11 illustrates a side view of a bending area of a display apparatus according to another embodiment.
Figure 12:
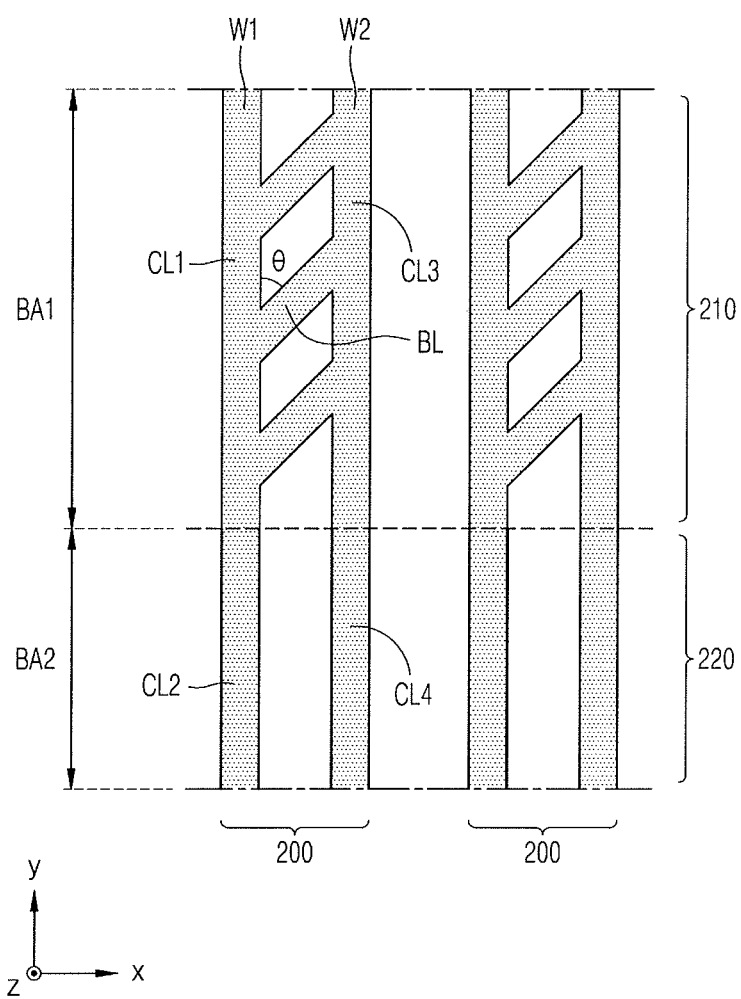
FIG. 12 illustrates a plan view of a part of the bending area of the display apparatus of FIG. 11.

FIG. 11 illustrates a side view of a bending area of a display apparatus according to another embodiment. FIG. 12 illustrates a plan view of a part of the bending area of the display apparatus of FIG. 11.

The embodiment of FIG. 11 is similar to the embodiment of FIG. 4, but they are different in the curvature of the bending area BA. For example, while, in the bending area BA of FIG. 4, the first bending area BA1 contacting the first area 1A that is a plane is bent with a curvature that is greater than that of the second bending area BA2, in the bending area BA of FIG. 11, the first bending area BA1 contacting the first area 1A that is a plane is characteristically bent with a curvature that is less than that of the second bending area BA2.

Referring to FIG. 11, the substrate 100 according to the present embodiment may include the first area 1A, the bending area BA, and the second area 2A, which are sequentially arranged. The wirings 200 may be arranged across the first area 1A, the bending area BA, and the second area 2A.

The bending area BA according to an embodiment may include the first bending area BA1 and the second bending area BA2, which are bent with different curvatures. The first bending area BA1 may be bent with a first curvature, and the second bending area BA2 may be bent with a second curvature different from the first curvature. In an implementation, the second curvature may be greater than the first curvature. For example, the radius of curvature R1 of the first bending area BA1 may be greater than the radius of curvature R2 of the second bending area BA2.

In an implementation, as illustrated in FIG. 11, the first bending area BA1 and the second bending area BA2 may be arranged approximately symmetrically with respect to the bending axis BAX. In an implementation, the first bending area BA1 and the second bending area BA2 having different curvatures may be a part or the whole of the bending area BA, and may not necessarily be symmetric.

Referring to FIG. 12, the second wiring 220 on the second bending area BA2 (that is bent with a relatively large curvature) may receive relatively greater stress than the first wiring 210 on the first bending area BA1, and thus the probability of occurrence of defects such as cracks and short-circuits could increase.

Accordingly, in FIG. 12, as the shape of each of the wirings 200 is implemented to be different according to the curvature of the bending area BA, an optimal shape may be adopted according to a degree of stress.

Referring to FIG. 12, each of the wirings 200 may include the first wiring 210 having a first shape on the first bending area BA1 and the second wiring 220 having a second shape on the second bending area BA2.

Each of the wirings 200 may have a multi-wiring shape on the bending area BA. For example, each of the wirings 200 may be branched and may include the first branch wiring W1 and the second branch wiring W2, which are on the bending area BA. The first branch wiring W1 may include the first conductive line CL1 on the first bending area BA1 and the second conductive line CL2 on the second bending area BA2, and the second branch wiring W2 may include the third conductive line CL3 on the first bending area BA1 and the fourth conductive line CL4 on the second bending area BA2.

The first wiring 210 on the first bending area BA1 may include the first conductive line CL1 and the third conductive line CL3, and the second wiring 220 on the second bending area BA2 may include the second conductive line CL2 and the fourth conductive line CL4.

The second bending area BA2 may be bent with a relatively large curvature compared to the first bending area BA1, stress may concentrate thereon, and may have a structure strong against stress.

In an implementation, the first wiring 210 may have a ladder shape. The first wiring 210 of FIG. 12 has the same shape as the second wiring 220 of FIG. 4, the above descriptions are used.

In an implementation, the second wiring 220 may have a stripe shape. The second wiring 220 of FIG. 12 has the same shape as the first wiring 210 of FIG. 4, the above descriptions are used.

Figure 13:
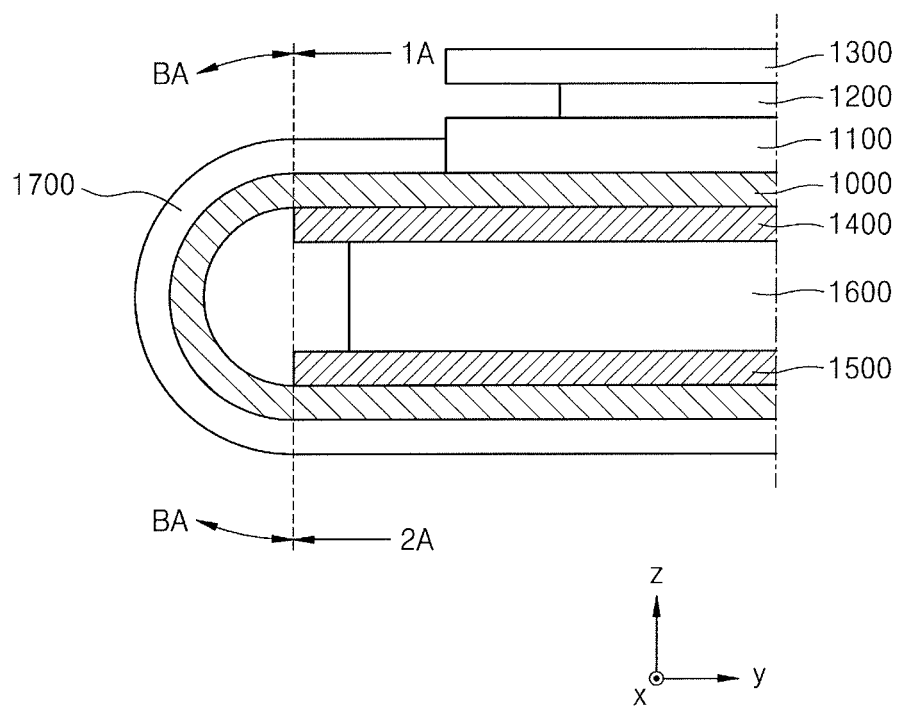
FIG. 13 illustrates a cross-sectional view of a display apparatus according to another embodiment.
Figure 14:
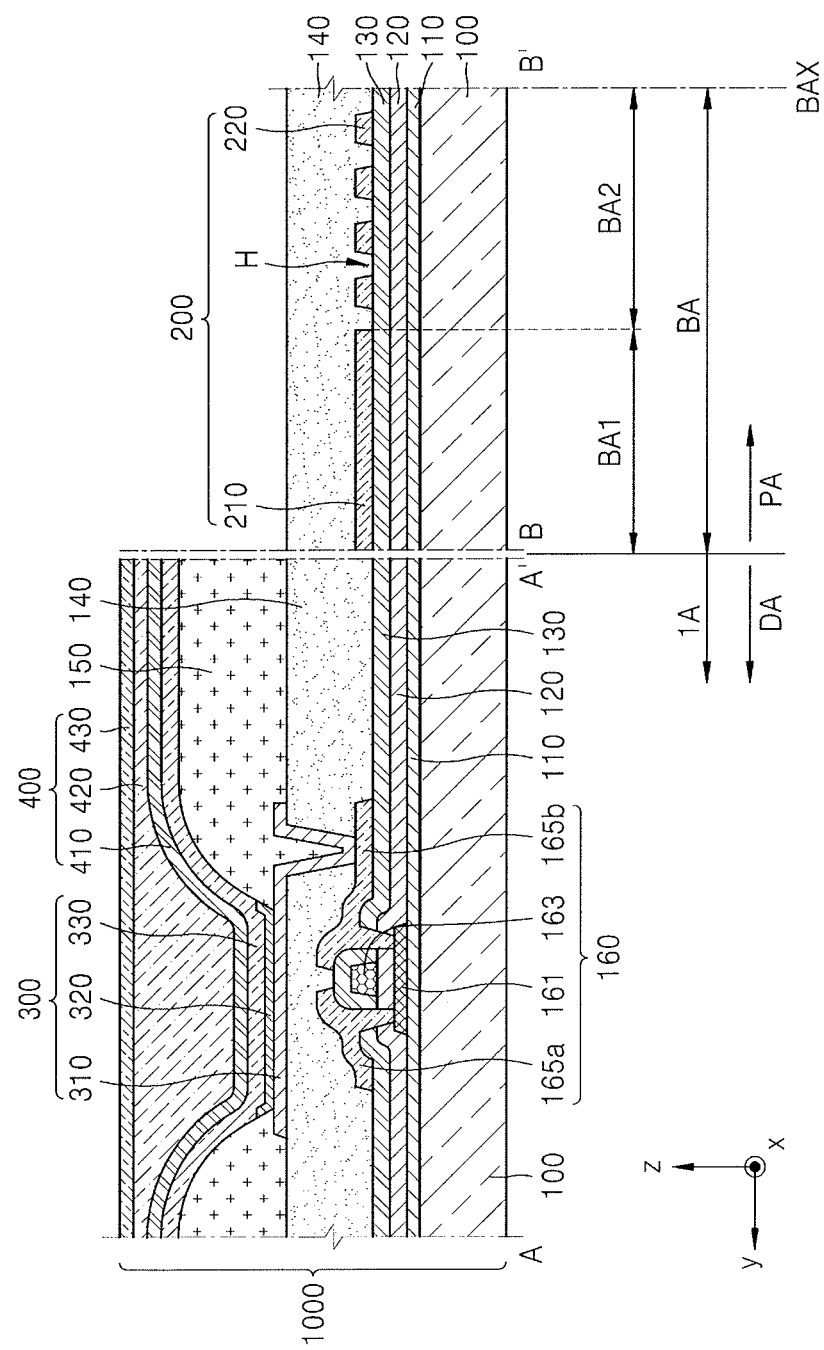
FIG. 14 illustrates a cross-sectional view of the display panel structure of FIG. 13.

FIG. 13 illustrates a cross-sectional view of a display apparatus 1000 according to another embodiment. FIG. 14 illustrates a cross-sectional view of the display panel structure 1000 of FIG. 13. FIG. 14 corresponds to a sectional structure taken along lines A-A' and B-B' of the display apparatus 1 of FIG. 2.

Referring to FIGS. 13 and 14, the display panel 1000 may have a partially bent structure.

Referring first to FIG. 14, the structure of the display panel 1000 is described.

Referring to the display area DA, an OLED 300 and a thin film transistor 160 to which the OLED 300 is electrically connected may be located in the display area DA of the substrate 100. Although not illustrated, the thin film transistor 160 may be disposed in the peripheral area PA outside the display area DA, as necessary. A thin film transistor (not shown) located in the peripheral area PA may be, for example, a part of a drive circuit for controlling an electrical signal applied to the display area DA.

A buffer layer 110 including an inorganic material such as silicon oxide, silicon nitride, and/or silicon oxynitride may be arranged on the substrate 100. The buffer layer 110 may increase smoothness of an upper surface of the substrate 100 or prevent or reduce intrusion of impurities from the substrate 100 into the thin film transistor 160.

The thin film transistor 160 may be arranged on the buffer layer 110. The thin film transistor 160 may include a semiconductor layer 161 including amorphous silicon, polycrystalline silicon, or an organic semiconductor material, a gate electrode 163, a source electrode 165*a*, and a drain electrode 165*b*.

To secure insulation between the semiconductor layer 161 and the gate electrode 163, a gate insulating film 120 including an inorganic material such as silicon oxide, silicon nitride, and/or silicon oxynitride may be interposed between the semiconductor layer 161 and the gate electrode 163.

In addition, an interlayer insulating film 130 including an inorganic material such as silicon oxide, silicon nitride, and/or silicon oxynitride may be arranged on the gate electrode 163. The source electrode 165*a* and the drain electrode 165*b* may be arranged on the interlayer insulating film 130.

A first insulating layer 140 may be arranged on the thin film transistor 160. The first insulating layer 140 may roughly planarize an upper surface of the thin film transistor 160 when the OLED 300 is disposed on the thin film transistor 160. The first insulating layer 140 may be formed of, for example, an organic material such as acryl, benzocyclobutene (BCB), or hexamethyldisiloxane (HMDSO).

The OLED 300 having a pixel electrode 310, the counter electrode 330, and an intermediate layer 320 interposed between and having an emission layer may be located on the first insulating layer 140. The pixel electrode 310, as illustrated in FIG. 14, contacts any one of the source electrode 165*a* and the drain electrode 165*b* via a contact hole formed in the first insulating layer 140, to be electrically connected to the thin film transistor 160.

A second insulating layer 150 may be disposed on the first insulating layer 140. The second insulating layer 150 has an opening corresponding to each of subpixels, that is, an opening to expose at least a center portion of the pixel electrode 310, thereby defining a pixel. Furthermore, the second insulating layer 150 increases a distance between an edge of the pixel electrode 310 and the counter electrode 330 above the pixel electrode 310, thereby preventing generation of an arc at the edge of the pixel electrode 310. The second insulating layer 150 may be formed of, for example, an organic material such as polyimide or HMDSO.

The intermediate layer 320 of the OLED 300 may include a low molecular or polymer material. When a low molecular material is included, the intermediate layer 320 may have a structure in which a hole injection layer (HIL), a hole transport layer (HTL), an emission layer (EML), an electron transport layer (ETL), and an electron injection layer (EIL) are stacked in a single or composite structure. Also, the intermediate layer 320 may include various organic material including copper phthalocyanine (CuPc), N,N'-Di(naphthalene-1-yl)-N,N-diphenyl-benzidine (NPB) or tris-8-hydroxyquinoline aluminum (Alq3). These layers may be formed in a vacuum deposition method.

When including a polymer material, the intermediate layer 320 may have a structure including the HTL and the EML. The HTL may include PEDOT, and the EML may include a polymer material such as a poly-phenylenevinylene (PPV) based material or a polyfluorene based material. The intermediate layer 320 may be formed by a screen printing method, an inkjet printing method, or a laser induced thermal imaging (LITI). The intermediate layer 320 may include an integrated layer across the pixel electrodes 310, or a patterned layer corresponding to each of the pixel electrodes 310.

The counter electrode 330 is disposed in an upper portion of the display area DA, and on the entire surface of the display area DA. The counter electrode 330 is integrally formed in the display area DA and may correspond to the pixel electrodes 310.

Since the OLED 300 may be easily damaged by external moisture or oxygen, a thin film encapsulation portion 400 is arranged on the OLED 300 to protect the OLED. Although not illustrated, the thin film encapsulation portion 400 may cover the display area DA and extend to the peripheral area PA outside the display area DA.

The thin film encapsulation portion 400 may include a first inorganic layer 410, an organic layer 420, and a second inorganic layer 430.

The first inorganic layer 410 may cover the counter electrode 330, and may include silicon oxide, silicon nitride, and/or silicon oxynitride. If necessary, other layers such as a capping layer may be disposed between the first inorganic layer 410 and the counter electrode 330. Since the first inorganic layer 410 is formed according to a structure thereunder, an upper surface of the first inorganic layer 410 may not be flat.

The organic layer 420 that covers the first inorganic layer 410 may have an upper surface that is roughly flat, unlike the first inorganic layer 410. The organic layer 420 may include, for example, polyethylene terephthalate, polyethylene naphthalate, polycarbonate, polyimide, polyethylene sulfonate, polyoxymethylene, polyacrylate, and/or hexamethyldisiloxane.

The second inorganic layer 430 may cover the organic layer 420, and may include, for example, silicon oxide, silicon nitride, and/or silicon oxynitride. The second inorganic layer 430 contacts the first inorganic layer 410 at an edge thereof located outside the display area DA, thereby preventing the organic layer 420 from being exposed to the outside.

Referring to the peripheral area PA, the wiring 200 may be on the bending area BA. The wiring 200 may include the first wiring 210 corresponding to the first bending area BA1 and the second wiring 220 corresponding to the second bending area BA2. Since the first bending area BA1 and the second bending area BA2 are bent with different curvatures, the first wiring 210 and the second wiring 220 may have different shapes. In an embodiment, in FIG. 14, the second wiring 220 may have the holes H. The shape of the wiring 200 in a plane may be one of the shapes of the above-described embodiments.

Referring to FIG. 13, a polarization member 1100 and a touch member 1300 are arranged in the first area 1A of the display panel 1000 of FIG. 14, and, for example, an adhesive member 1200 such as optically clear adhesive (OCA) may be disposed between the polarization member 1100 and the touch member 1300. Although FIG. 13 illustrates a case in which the touch member 1300 is separately attached above the display panel 1000, in another embodiment, the touch member 1300 may be directly provided on the thin film encapsulation portion 400 to be included in the display panel 1000.

A structure 1600 for maintaining a bending structure may be arranged between the first area 1A and the second area 2A of the display panel 1000, and protection films 1400 and 1500 may be disposed between the structure 1600 and the first and second areas 1A and 2A of the display panel 1000.

An organic layer 1700 is arranged in the bending area BA of the display panel 1000. The organic layer 1700 reduces stress in the bending area BA, thereby protecting the wirings 200 located in the bending area BA. The organic layer 1700 may extend to a part of each of the first area 1A and the second area 2A.

Figure 15:
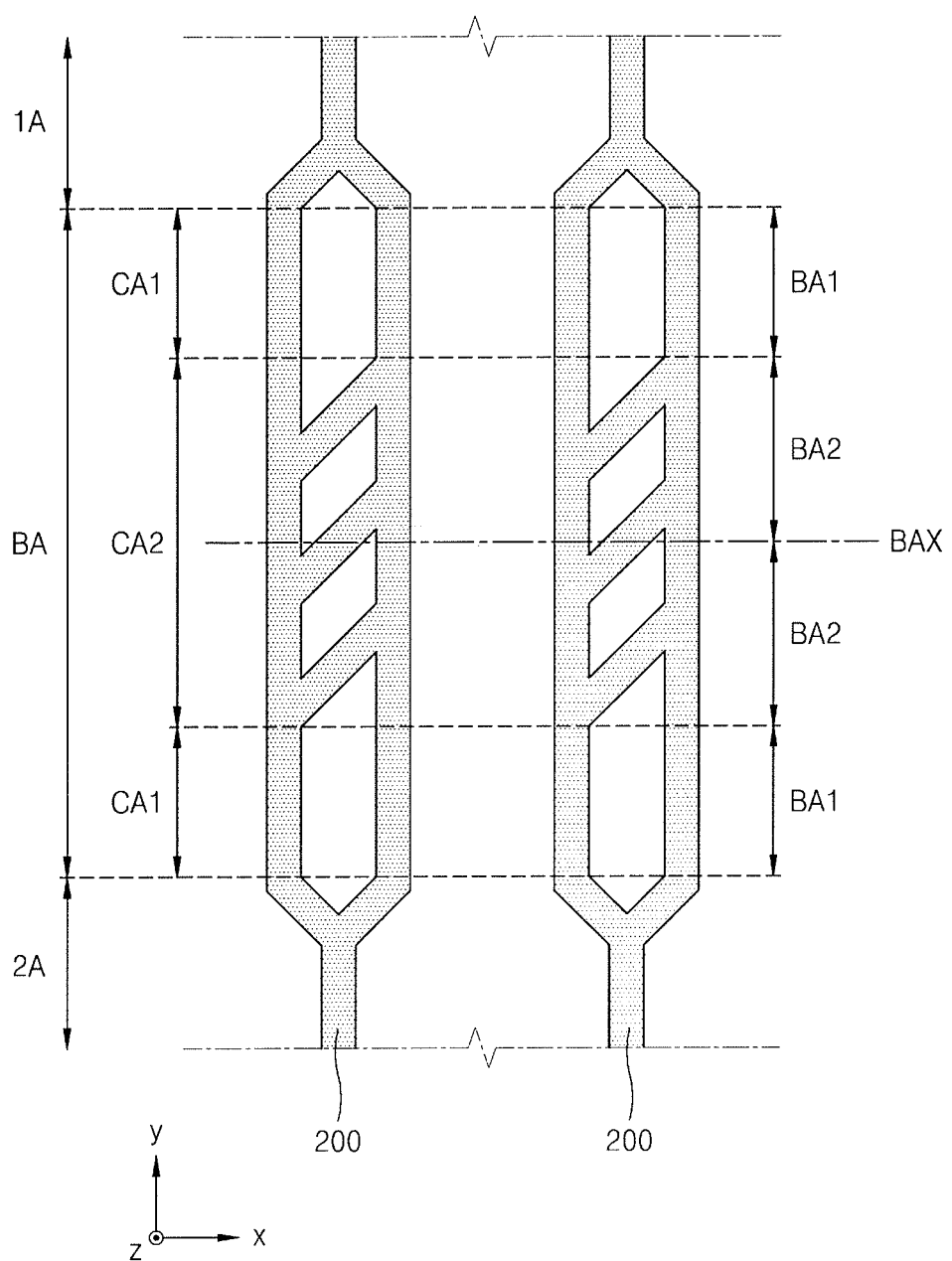
FIGS. 15 and 16 illustrate plan views of a part of a display apparatus according to another embodiment.
Figure 16:
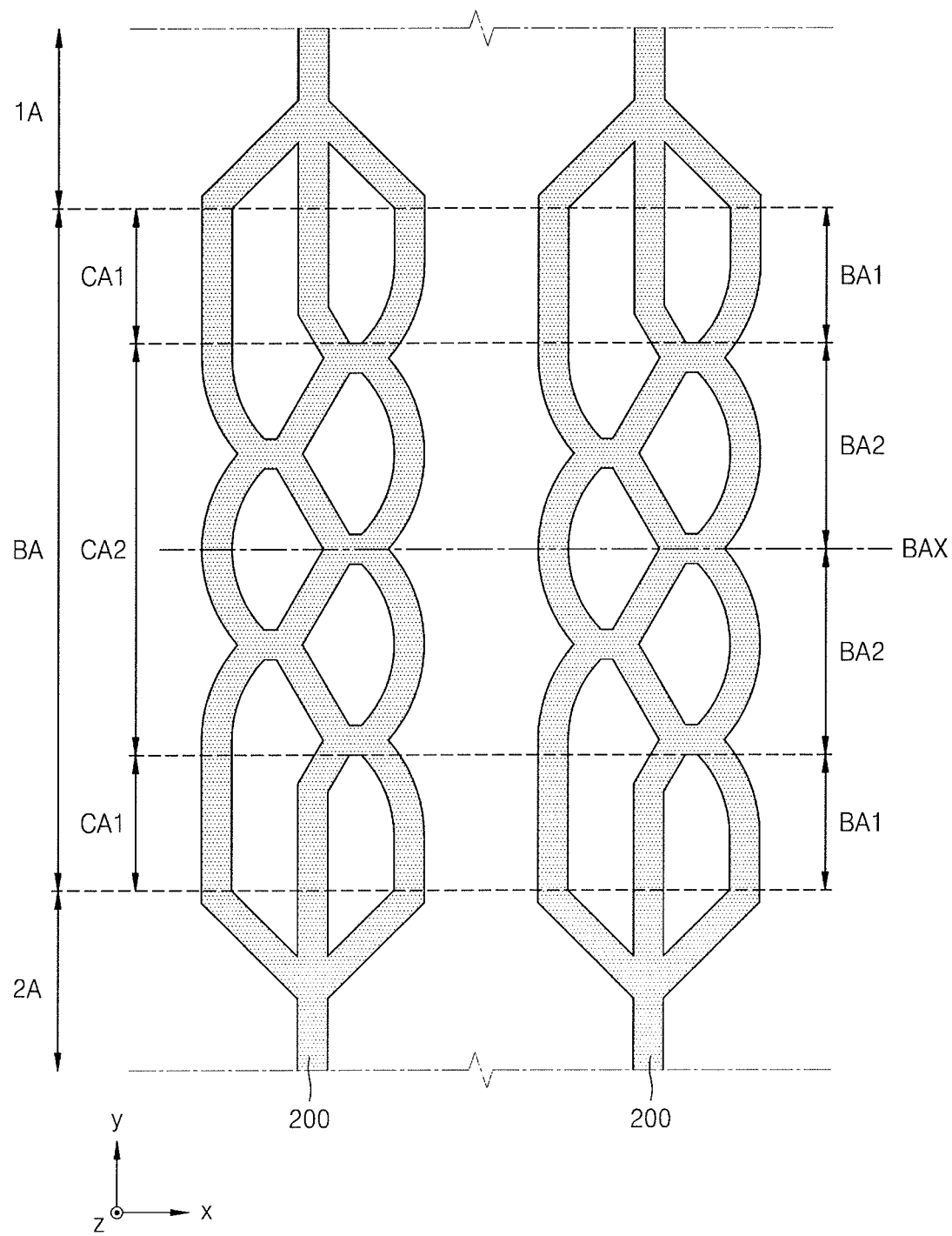

FIGS. 15 and 16 illustrate plan views of bending areas of the display apparatus according to another embodiment, and parts of the first and second areas contacting the bending areas.

Referring to FIG. 15, the first and second bending areas BA1 and BA2 of FIG. 15 correspond to the first and second bending areas BA1 and BA2 of FIG. 5. As described above in FIG. 5, each of the wirings 200 may be branched and includes the first and second branch wirings W1 and W2 on the bending area BA. The bending area BA may include a first curvature area CA1 that is bent with first curvature and a second curvature area CA2 that is bent with a second curvature. The first curvature area CA1 corresponds to or may be on the first bending area BA1, and the second curvature area CA2 corresponds to or may be on the second bending area BA2. The second curvature area CA2 may include the bending axis BAX, and the first and second bending areas BA1 and BA2 may be arranged symmetrically with respect to the bending axis BAX.

The shape of the wirings 200 is identical to the description in FIG. 5, and redundant descriptions are omitted.

Referring to FIG. 16, the first and second bending areas BA1 and BA2 of FIG. 15 correspond to the first and second bending areas BA1 and BA2 of FIG. 8. As described above in FIG. 8, each of the wirings 200 may be branched and includes the first, second, and third branch wirings W1, W2, and W3 on the bending area BA. The bending area BA may include the first curvature area CA1 that is bent with a first curvature and the second curvature area CA2 that is bent with a second curvature. The first curvature area CA1 corresponds to or may be on the first bending area BA1, and the second curvature area CA2 corresponds to or may be on the second bending area BA2. The second curvature area CA2 may include the bending axis BAX, and the first and second bending areas BA1 and BA2 may be arranged symmetrically with respect to the bending axis BAX.

The shape of the wirings 200 may be identical to the description in FIG. 8, redundant descriptions are omitted.

By way of summation and review, in some display apparatuses, defects could occur or the life of a display apparatus could be reduced in a process of manufacturing a bendable display apparatus.

As described above, according to the above-described embodiments, long life of a display apparatus may be secured and occurrence of defects such as short-circuits in a manufacturing process may be reduced.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. A display apparatus, comprising:
a flexible substrate, the flexible substrate including:
 a first area where an image is displayed,
 a second area separated from the first area, and
 a bending area between the first area and the second area;
a display on the first area of the flexible substrate;
a pad on the second area of the flexible substrate; and
a plurality of wirings on the flexible substrate, each of the plurality of wirings including:
 a first wiring portion having a first shape; and
 a second wiring portion being electrically connected to the first wiring portion in the bending area and having a second shape that is different from the first shape, the first wiring portion and the second wiring portion passing through the bending area,
wherein
at least one wiring of the plurality of wirings is branched on the bending area so as to include at least a portion having multiple conductive lines running in parallel and at least one bridge line connecting the multiple conductive lines.

2. The display apparatus of claim 1, wherein the bending area includes:
a first bending area that contacts the first area and has a first curvature; and
a second bending area that contacts the first bending area and has a second curvature that is different from the first curvature.

3. The display apparatus of claim 2, wherein the first curvature is greater than the second curvature.

4. The display apparatus of claim 2, wherein:
the first wiring portion is on the first bending area, and
the second wiring portion is on the second bending area.

5. The display apparatus of claim 2, wherein:
the second curvature is greater than the first curvature, and
the second wiring portion has a stripe shape.

6. The display apparatus of claim 5, wherein the first wiring portion includes a plurality of holes.

7. The display apparatus of claim 2, wherein:
the bending area is symmetrical with respect to a bending axis, and
the first bending area and the second bending area are at one side with respect to the bending axis.

8. The display apparatus of claim 1, wherein the multiple conductive lines include a first branch wiring and a second branch wiring, the first branch wiring and the second branch wiring being on the bending area.

9. The display apparatus of claim 8, wherein:
the bending area includes a first bending area and a second bending area,
the first branch wiring includes a first conductive line on the first bending area and a second conductive line on the second bending area, and
the second branch wiring includes a third conductive line on the first bending area and a fourth conductive line on the second bending area.

10. The display apparatus of claim 9, wherein each of the first conductive line and the third conductive line of the first wiring portion has a stripe shape.

11. The display apparatus of claim 9, wherein the bridge line connects the second conductive line to the fourth conductive line.

12. The display apparatus of claim 11, wherein the bridge line is arranged in a direction crossing the second conductive line and the fourth conductive line.

13. The display apparatus of claim 8, wherein the first wiring portion is inclined at an angle with respect to the second wiring portion.

14. The display apparatus of claim 13, wherein:
the bending area is bent along a bending axis extending in a first direction, and
the second wiring portion is arranged orthogonal to the bending axis.

15. The display apparatus of claim 8, wherein a same signal is capable of being input to each of the first branch wiring and the second branch wiring.

16. The display apparatus of claim 1, wherein the first wiring portion has a stripe shape.

17. The display apparatus of claim 1, wherein the bending area includes:
a first bending area, the first wiring portion being on the first bending area, and
a second bending area located on a side of the first bending area opposite of the first area, the second wiring portion being on the second bending area.

18. A display apparatus, comprising:
a flexible substrate, the flexible substrate including:
a first area where an image is displayed,
a second area separated from the first area, and
a bending area between the first area and the second area, the bending area including a first bending area, a third bending area, and a second bending area between the first bending area and the third bending area;
a display on the first area of the flexible substrate;
a pad on the second area of the flexible substrate; and
a plurality of wirings on the flexible substrate, each of the plurality of wirings including:
a first wiring portion in the first bending area having a first shape;
a second wiring portion in the second bending area being electrically connected to the first wiring portion in the bending area, the second wiring portion having a second shape that is different from the first shape; and
a third wiring portion in the third bending area being electrically connected to the first wiring portion and the second wiring portion in the bending area, the third wiring portion having a third shape that is different from the first shape and the second shape, wherein
the plurality of wirings in the second bending area are branched so as to include at least one bridge line connecting multiple conductive lines,
the plurality of wirings in the third bending area is branched so as to include at least a portion having multiple conductive lines running in parallel and at least one bridge line connecting the multiple conductive lines,
the second bending area includes a second conductive line and a fourth conductive line electrically connected to a respective first conductive line and third conductive line of the first bending area; and
the at least one bridge line in the second bending area includes a first bridge line and a second bridge line that are arranged in directions crossing each other.

19. The display apparatus of claim 18, wherein each of the second conductive line and the fourth conductive line has a portion contacting the at least one bridge line in the second bending area, the portion having an inwardly recessed shape.

20. The display apparatus of claim 18, wherein each of the second conductive line and the fourth conductive line has a portion contacting the at least one bridge line in the second bending area, the portion having an outwardly rounded shape.

21. The display apparatus of claim 18, wherein, on a plane, the second wiring portion includes a hole surrounded by the second conductive line and the at least one bridge line in the second bending area or surrounded by the fourth conductive line and the at least one bridge line in the second bending area, the hole having a fan shape.

22. A display apparatus, comprising:
a flexible substrate, the flexible substrate including:
a first area where an image is displayed,
a second area separated from the first area, and
a bending area between the first area and the second area;
a display on the first area of the flexible substrate;
a pad on the second area of the flexible substrate; and
a plurality of wirings on the flexible substrate, each of the plurality of wirings including:
a first wiring portion having a first shape; and
a second wiring portion being electrically connected to the first wiring portion in the bending area and having a second shape that is different from the first shape, the first wiring portion and the second wiring portion passing through the bending area,
wherein the second wiring portion has a plurality of holes.

23. The display apparatus of claim 22, wherein the second wiring portion has a curved shape in at least a partial area thereof.

24. A display apparatus, comprising:
a flexible substrate, the flexible substrate including:
a first area where an image is displayed,
a second area separated from the first area, and
a bending area between the first area and the second area;
a display on the first area of the flexible substrate;
a pad on the second area of the flexible substrate; and
a plurality of wirings on the flexible substrate, each of the plurality of wirings including:
a first wiring portion having a first shape; and
a second wiring portion being electrically connected to the first wiring portion in the bending area and having a second shape that is different from the first shape, the first wiring portion and the second wiring portion passing through the bending area,
wherein
the bending area includes:
a first bending area that contacts the first area and has a first curvature;
a second bending area that contacts the first bending area and has a second curvature that is different from the first curvature; and
a third bending area that contacts the second bending area and has a third curvature that is different from the first curvature and the second curvature, and
each of the plurality of wirings includes a third wiring in the third bending area and having a third shape that is different from the first shape and the second shape.

25. The display apparatus of claim 24, wherein the first curvature, the second curvature, and the third curvature satisfy the following equation:

First Curvature>Second Curvature>Third Curvature.

26. A display apparatus, comprising:
a substrate that includes a bending area between a first area and a second area and bent around a bending axis, the bending area including:

a first curvature area bent with a first curvature; and a second curvature area between the first curvature area and each of the first area and the second area and bent with a second curvature that is different from the first curvature;

a display in the first area of the substrate; and a plurality of wirings extending in a direction crossing the bending axis and passing through the bending area, each of the plurality of wirings having a first shape in the first curvature area and having a second shape that is different from the first shape in the second curvature area.

27. The display apparatus of claim 26, wherein:
the second curvature is greater than the first curvature, and the second shape is a stripe shape.

28. The display apparatus of claim 26, wherein:
the first curvature is greater than the second curvature, and the first shape is a stripe shape.

29. The display apparatus of claim 26, wherein each of the plurality of wirings is branched and has a multi-wiring shape on the bending area.

30. The display apparatus of claim 29, wherein each of the plurality of wirings further includes a bridge line connecting multiple wirings of the multi-wiring shape to each other in an area of the first curvature area and the second curvature area that has a smaller curvature than the first curvature area.

31. The display apparatus of claim 29, wherein each of the plurality of wirings includes a plurality of holes in an area of the first curvature area and the second curvature area that has a smaller curvature than the first curvature area.

32. The display apparatus of claim 29, wherein each of the plurality of wirings has a curved shape in at least a part thereof in an area of the first curvature area and the second curvature area that has a smaller curvature than the first curvature area.

* * * * *